(12) United States Patent
Avital

(10) Patent No.: US 10,159,159 B2
(45) Date of Patent: Dec. 18, 2018

(54) MULTIFUNCTIONAL CONNECTION SYSTEMS FOR VARIOUS DEVICES AND METHODS OF USE THEREOF

(71) Applicant: Mobile Synergy 26 International Limited, Dublin (IE)

(72) Inventor: Shalom Solomon Avital, Tarzana, CA (US)

(73) Assignee: Mobile Synergy 26 International Limited, Dublin (IE)

( * ) Notice: Subject to any disclaimer, the term of this patent is extended or adjusted under 35 U.S.C. 154(b) by 0 days.

(21) Appl. No.: 15/607,396

(22) Filed: May 26, 2017

(65) Prior Publication Data
US 2017/0347477 A1 Nov. 30, 2017

Related U.S. Application Data

(60) Provisional application No. 62/342,481, filed on May 27, 2016.

(51) Int. Cl.
*H01R 13/40* (2006.01)
*H05K 5/02* (2006.01)
(Continued)

(52) U.S. Cl.
CPC ......... *H05K 5/0247* (2013.01); *H05K 5/0004* (2013.01); *H05K 5/0234* (2013.01);
(Continued)

(58) Field of Classification Search
CPC .. H05K 5/0247; H05K 5/0004; H05K 5/0234; H05K 10/00; H01H 1/36; H02J 7/0054; H02B 1/38
(Continued)

(56) References Cited

U.S. PATENT DOCUMENTS 3,750,078 A * 7/1973 Bruder ................ H01C 10/20
                                                                333/81 A
3,885,483 A * 5/1975 Ikeya .................. B26D 7/2635
                                                                144/356
(Continued)

FOREIGN PATENT DOCUMENTS

| FR | 2 135 264 A1 | 12/1972 |
| KR | 101204510 B1 | 11/2012 |
| WO | 2015075724 A1 | 5/2015 |

OTHER PUBLICATIONS

International Search Report and Written Opinion for PCT Application No. PCT/IB2017/000777, dated Sep. 29, 2017.

*Primary Examiner* — Jean F Duverne
(74) *Attorney, Agent, or Firm* — Greenberg Traurig, LLP

(57) ABSTRACT

A connector including a first connector side having a first rotatable connector mechanism and a second connector side having a second rotatable connector mechanism, the first rotatable connector mechanism and the second rotatable connector mechanism being configured to engage one another when the first connector side and the second connector side abut one another at a first angular orientation, the first rotatable connector mechanism and the second rotatable connector mechanism being configured to disengage from one another when the first connector side and the second connector side are rotated away from the first angular orientation in at least a first direction.

20 Claims, 46 Drawing Sheets

(51) Int. Cl.
*H05K 5/00* (2006.01)
*H02J 7/00* (2006.01)
*H02B 1/38* (2006.01)
*H05K 10/00* (2006.01)

(52) U.S. Cl.
CPC .............. *H02B 1/38* (2013.01); *H02J 7/0054* (2013.01); *H05K 10/00* (2013.01)

(58) Field of Classification Search
USPC ........................................................ 439/595
See application file for complete search history.

(56) References Cited

U.S. PATENT DOCUMENTS

| | | | |
|---|---|---|---|
| 3,940,107 A * | 2/1976 | Allenbaugh, Jr. | .... F16K 5/0631 192/223.4 |
| 5,684,280 A * | 11/1997 | Franz | ....................... H01H 1/36 200/16 R |
| 7,114,197 B2 * | 10/2006 | Garneau | ................ A42B 3/085 2/418 |
| 7,168,969 B1 | 1/2007 | Wang | |
| 7,619,388 B1 | 11/2009 | Nana | |
| 7,726,994 B1 | 6/2010 | Willey | |
| 2006/0103493 A1 * | 5/2006 | Kley | ..................... H01P 1/2084 333/202 |
| 2008/0278899 A1 | 11/2008 | Hotelling et al. | |
| 2012/0071008 A1 | 3/2012 | Sessford | |
| 2012/0164849 A1 | 6/2012 | Lee et al. | |
| 2012/0175932 A1 * | 7/2012 | Moriyama | ........... B60N 2/0232 297/361.1 |
| 2013/0058023 A1 | 3/2013 | Supran et al. | |
| 2013/0150134 A1 | 6/2013 | Pliner et al. | |
| 2013/0303000 A1 | 11/2013 | Witter et al. | |
| 2014/0355200 A1 | 12/2014 | Thiers | |
| 2015/0171649 A1 | 6/2015 | Kim et al. | |

* cited by examiner

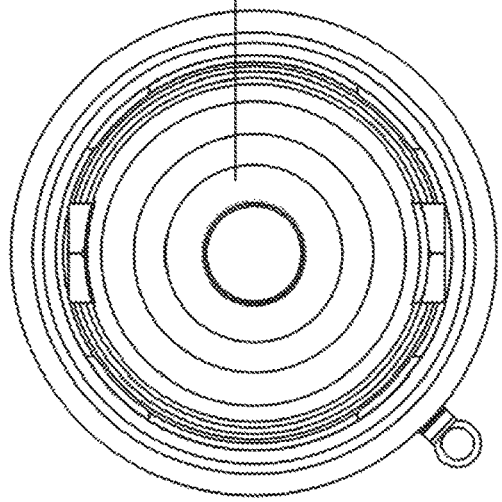
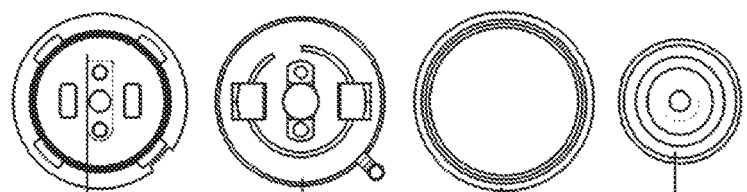
Fig 25.

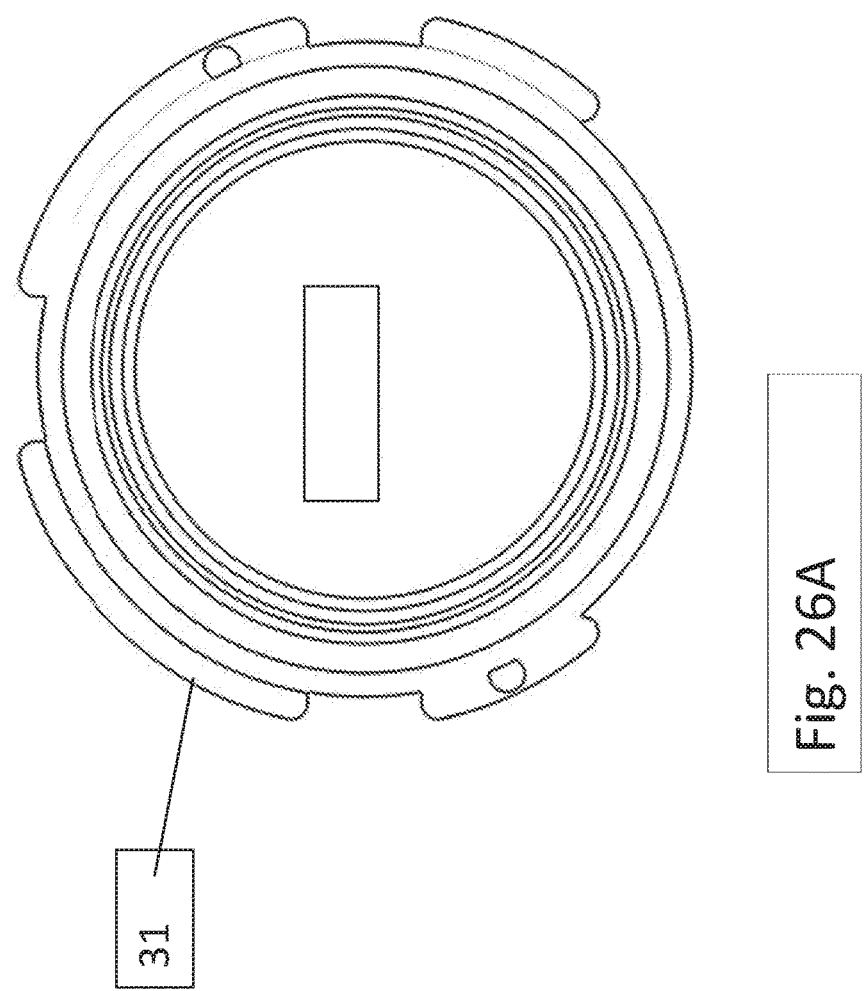

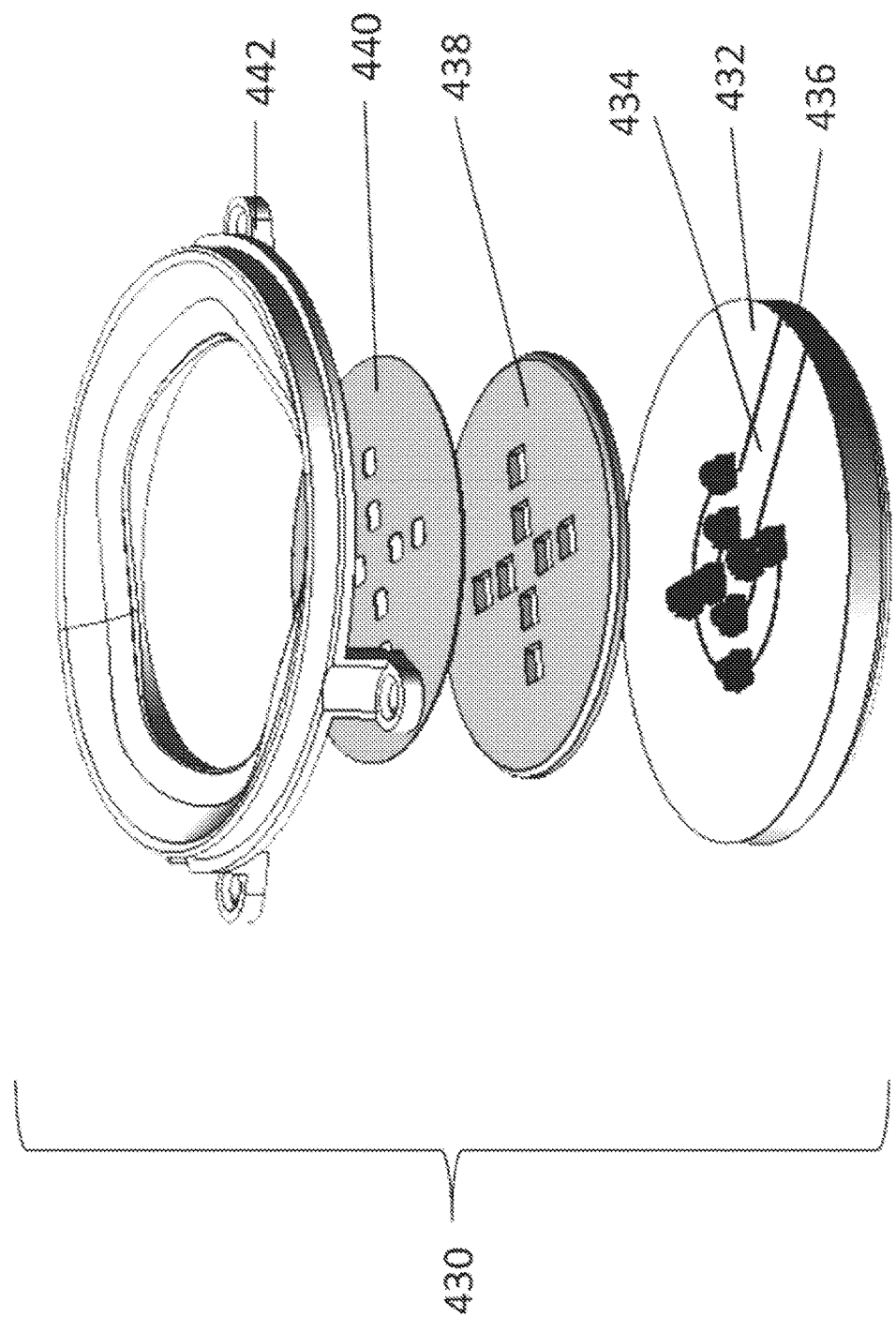

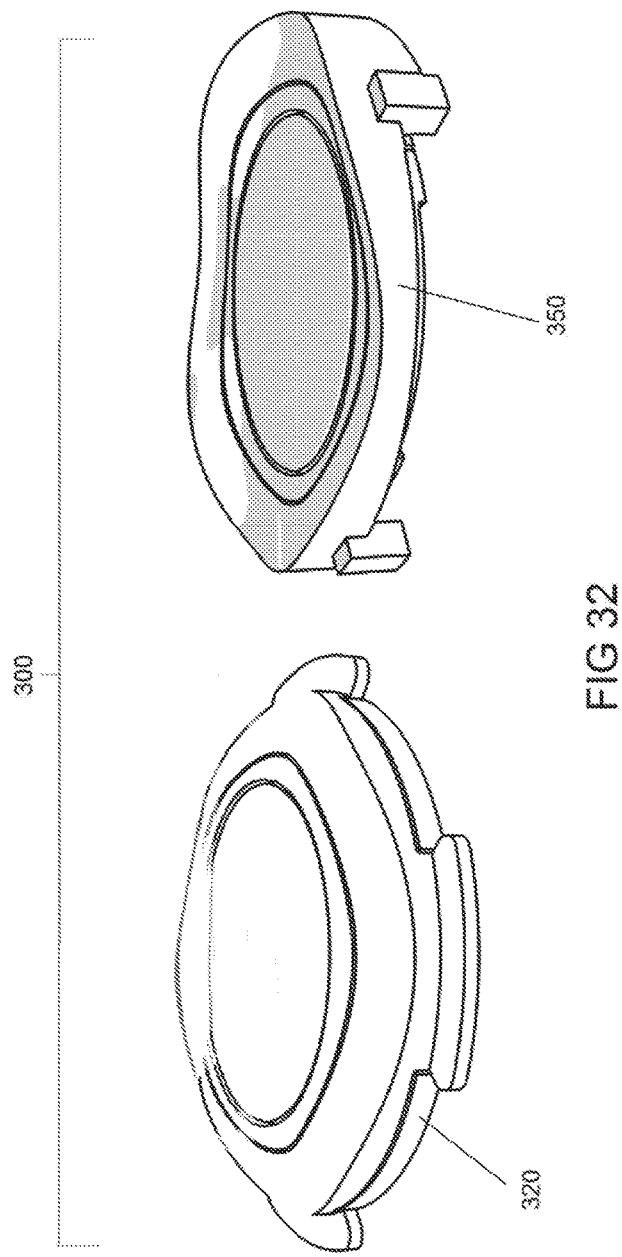

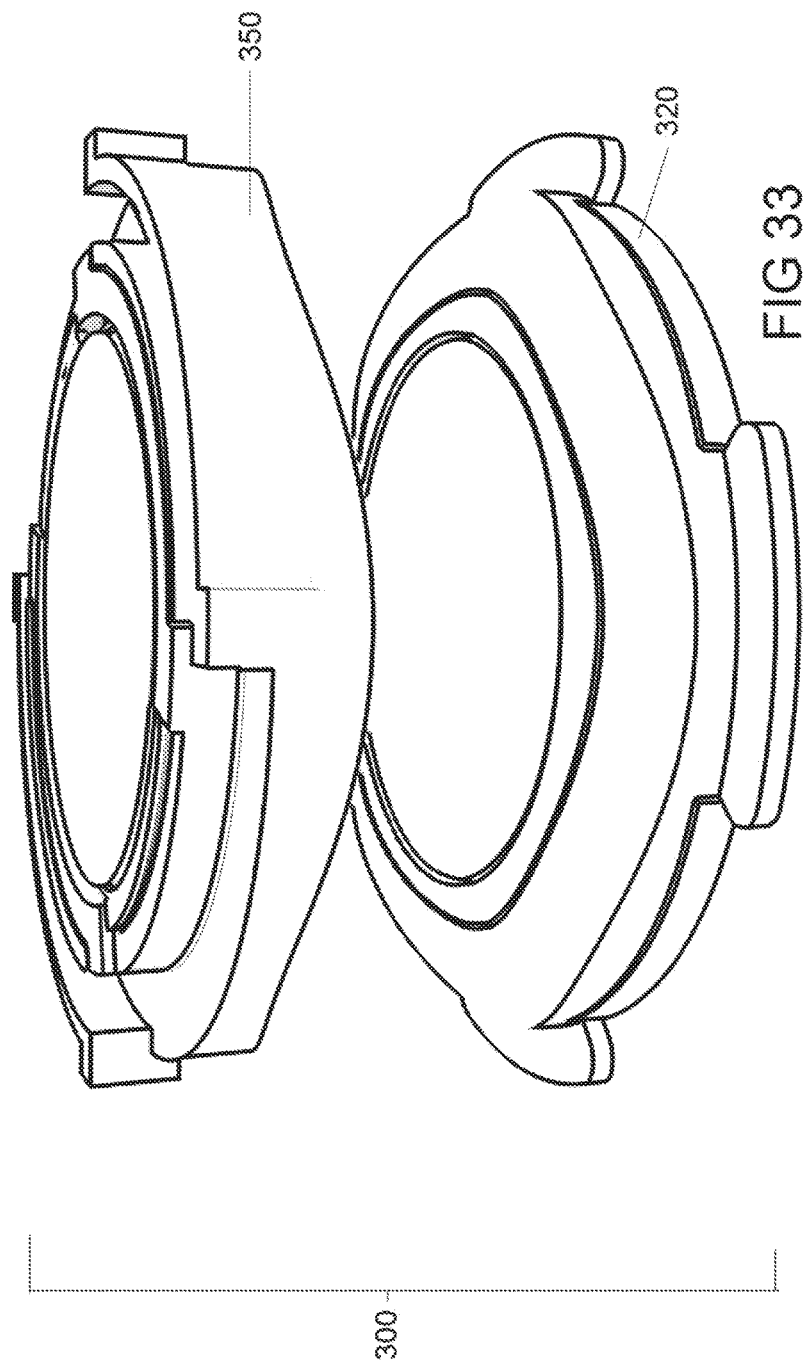

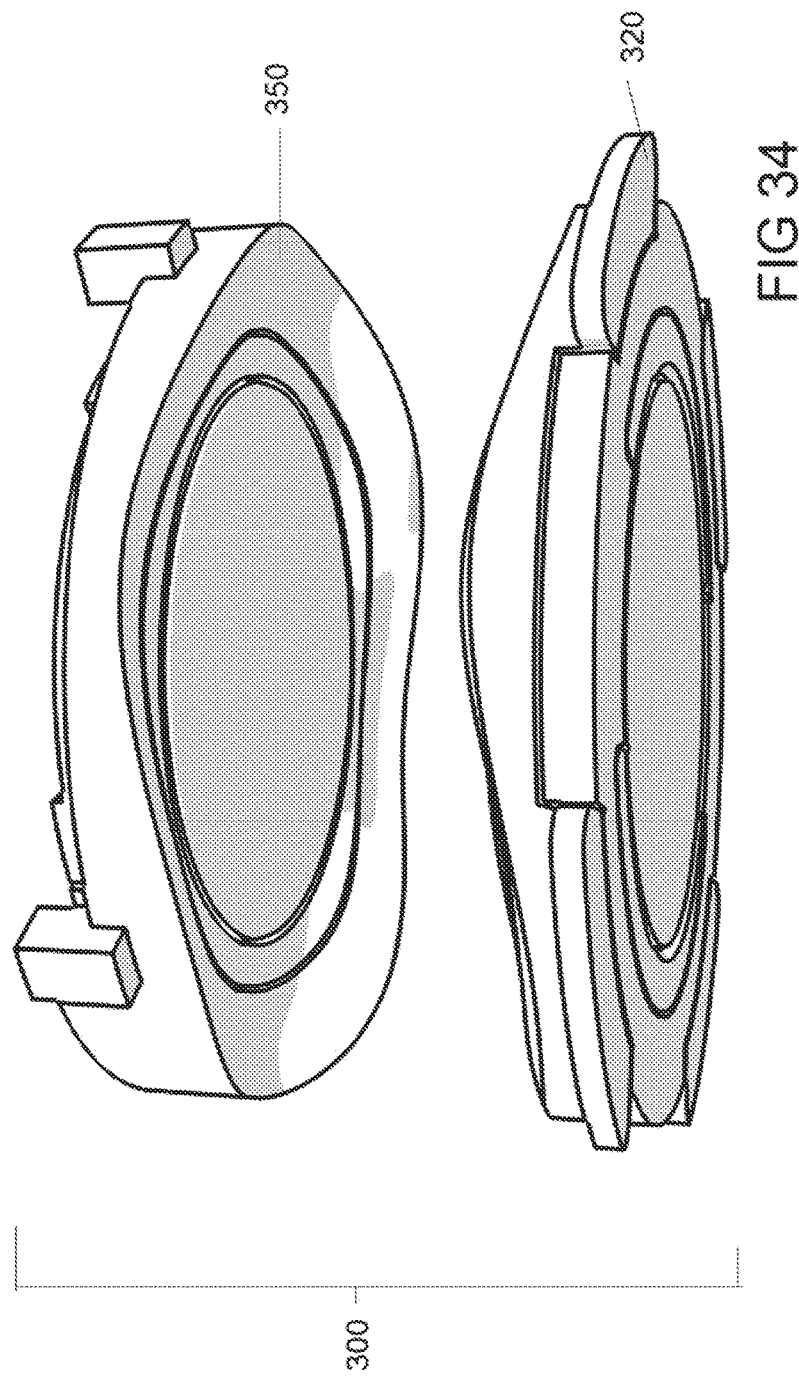

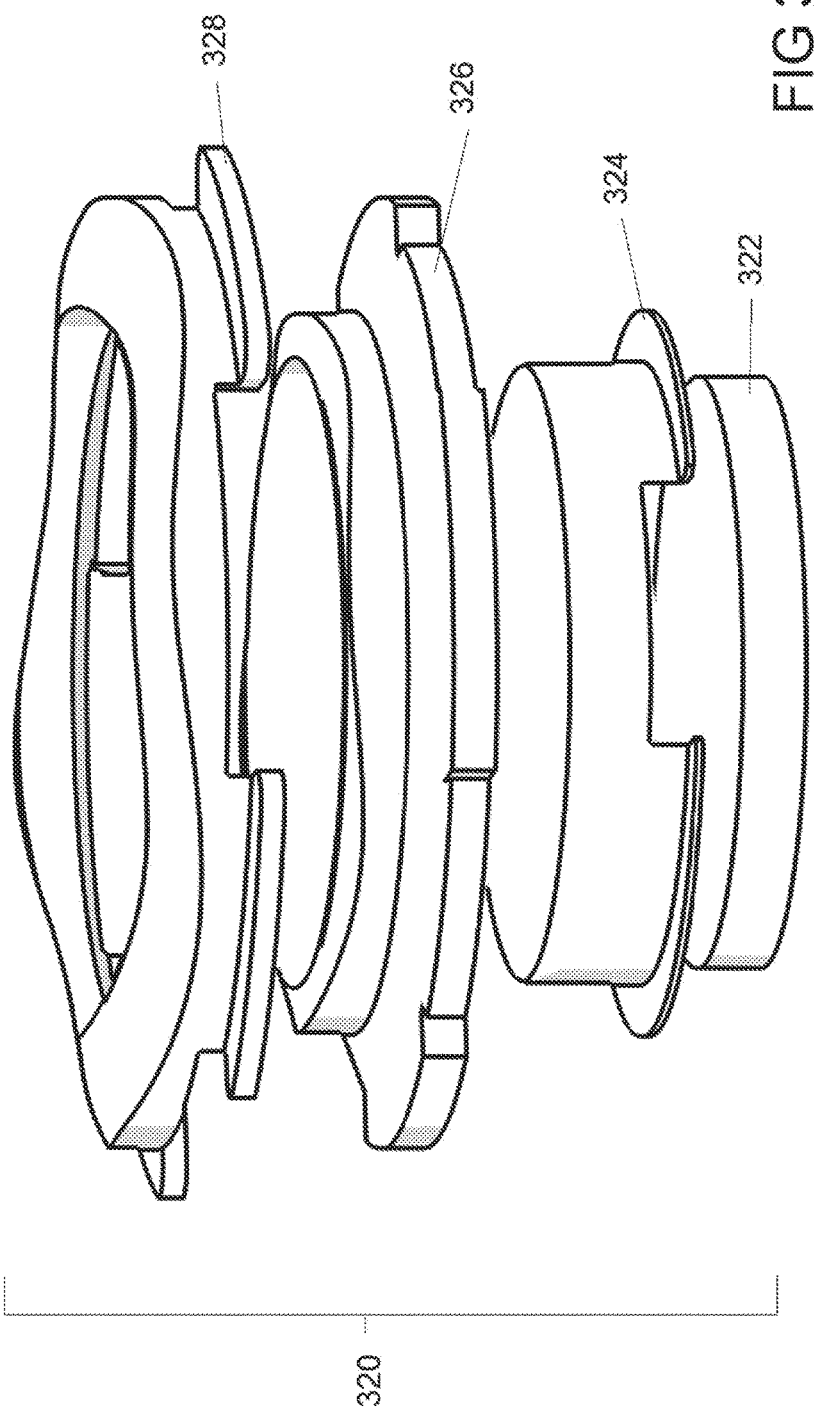

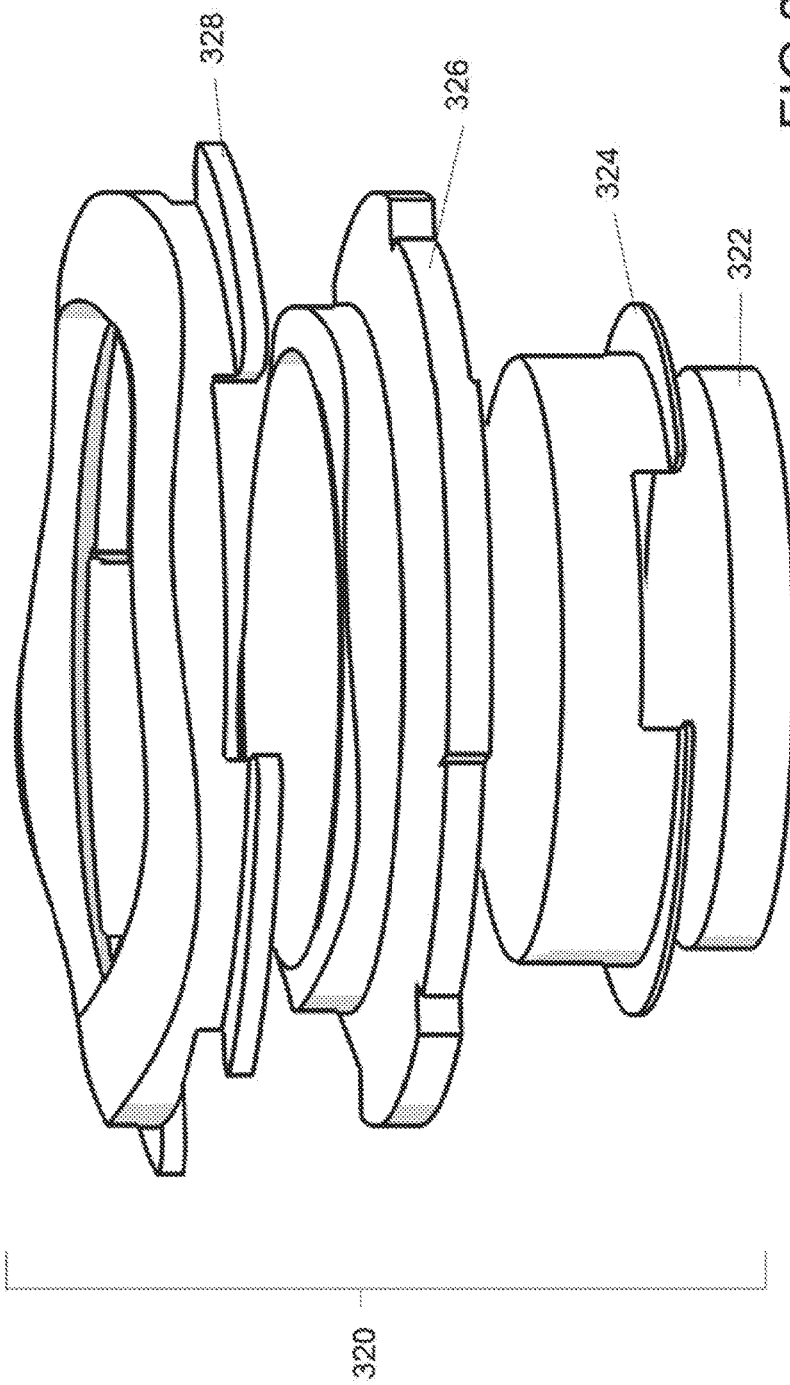

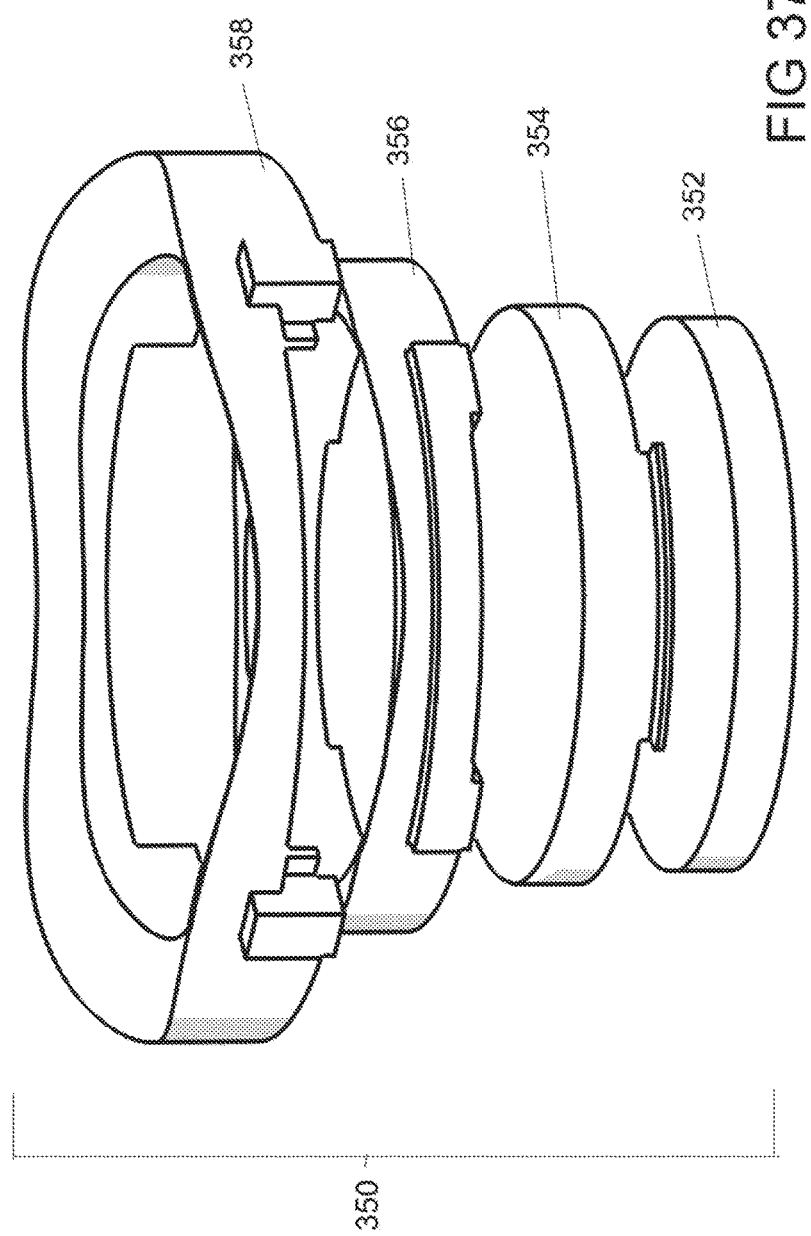

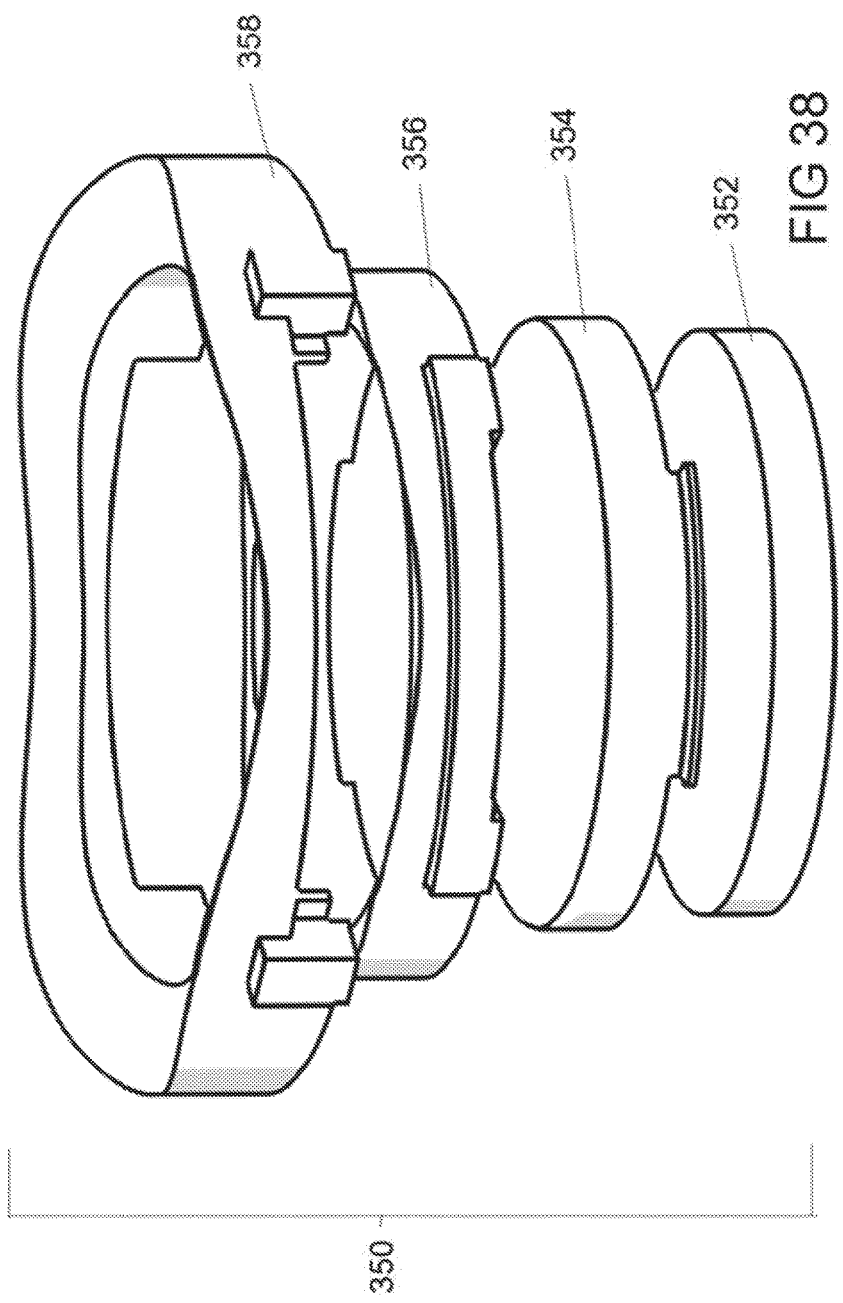

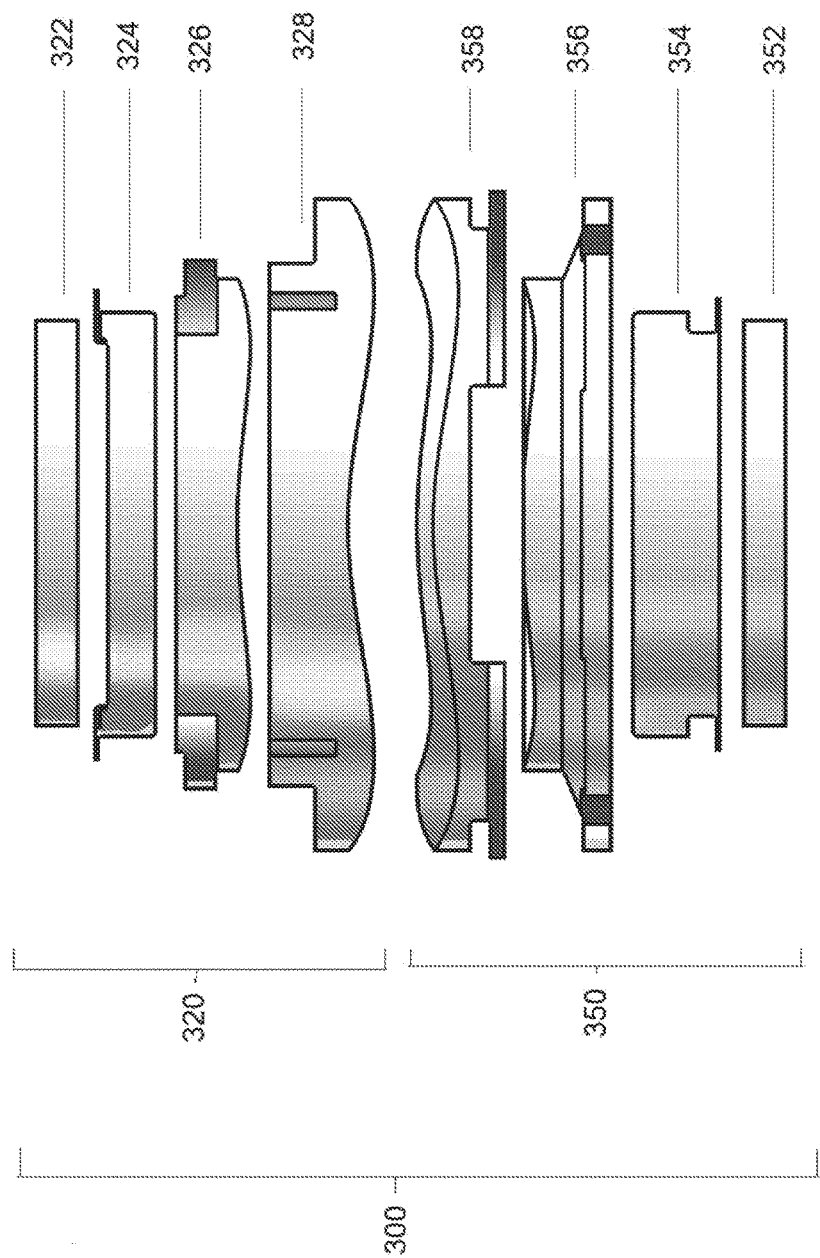

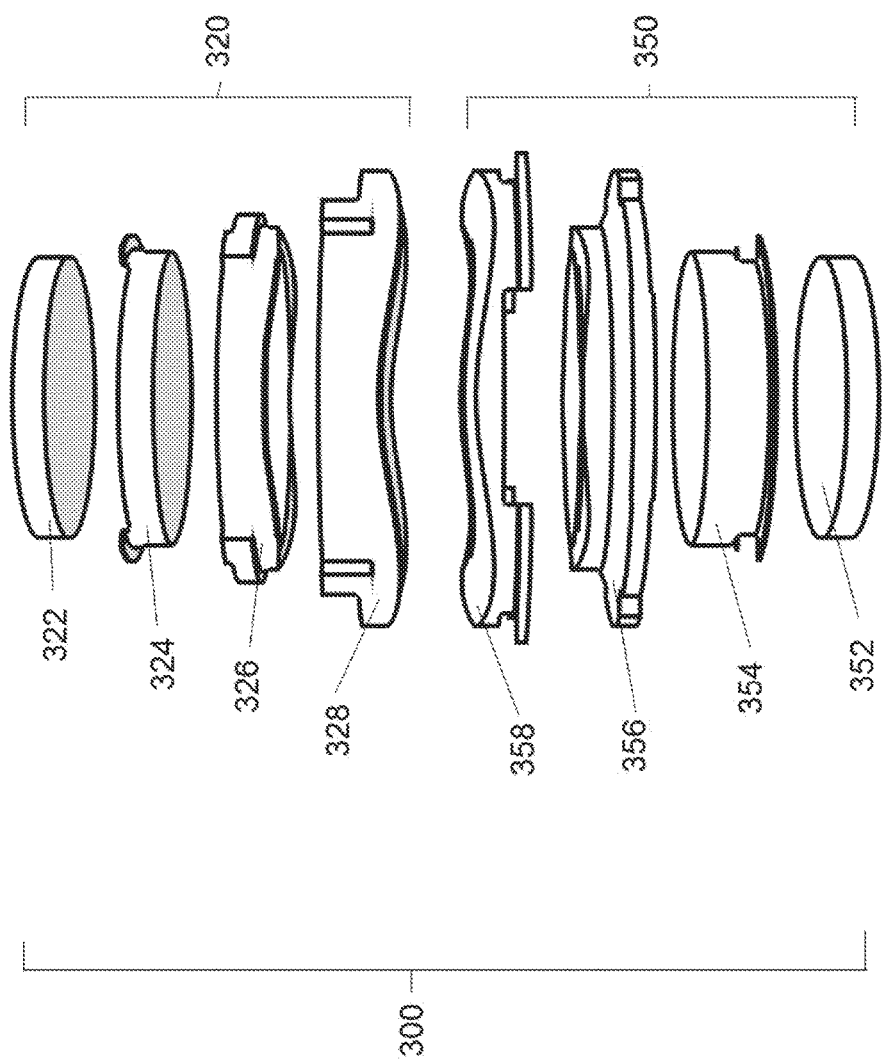

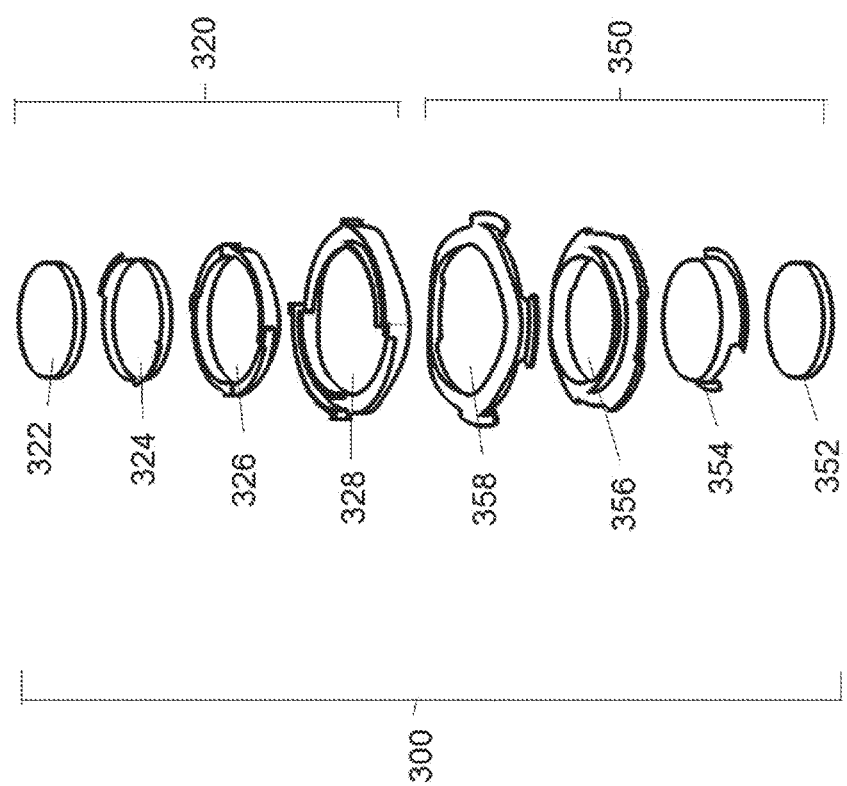

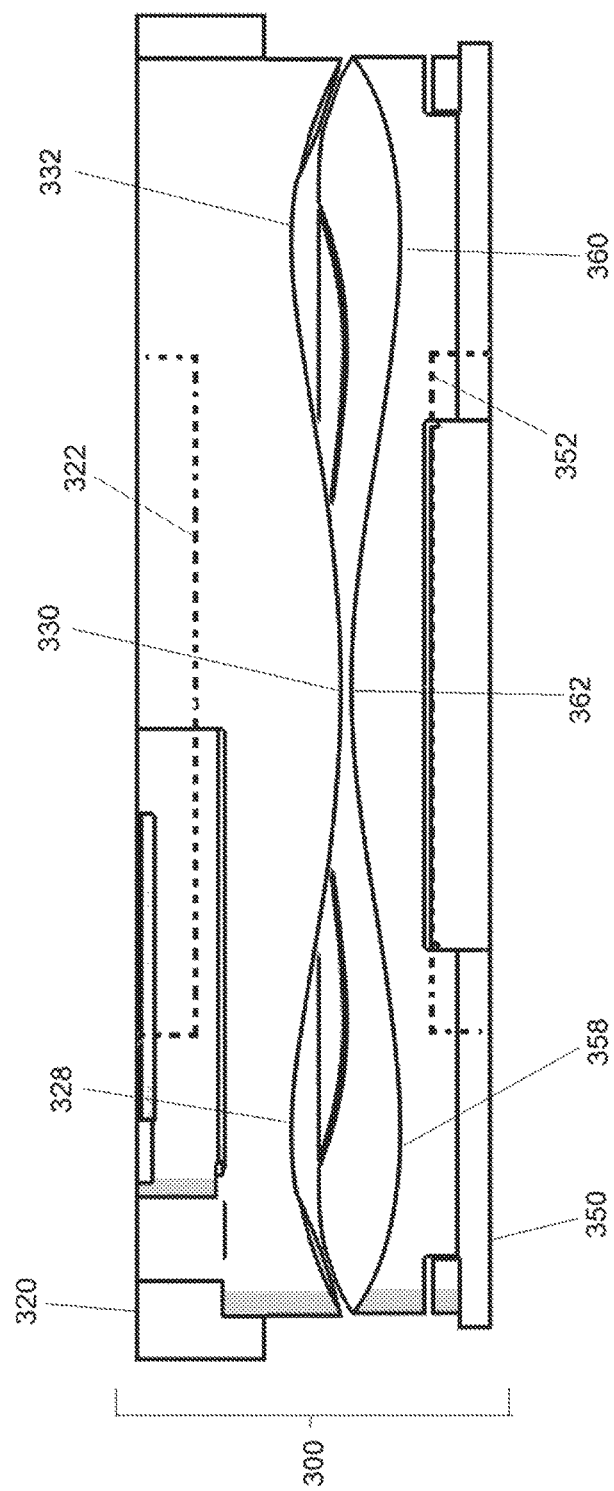

MULTIFUNCTIONAL CONNECTION SYSTEMS FOR VARIOUS DEVICES AND METHODS OF USE THEREOF

CROSS-REFERENCE TO RELATED APPLICATION

This application is a Section 111(a) application relating to and claiming the benefit of commonly-owned, U.S. Provisional Patent Application Ser. No. 62/342,481, filed May 27, 2016, entitled "MULTIFUNCTIONAL CONNECTION SYSTEMS FOR VARIOUS DEVICES AND METHODS OF USE THEREOF," the contents of which are incorporated herein by reference in their entirety.

FIELD OF THE INVENTION

The present invention relates to connectors and, more particularly, to connectors providing electrical conduction.

SUMMARY OF THE INVENTION

In an embodiment, a connector includes a first connector side having a first rotatable connector mechanism and a second connector side having a second rotatable connector mechanism, the first rotatable connector mechanism and the second rotatable connector mechanism being configured to engage one another when the first connector side and the second connector side abut one another at a first angular orientation, the first rotatable connector mechanism and the second rotatable connector mechanism being configured to disengage from one another when the first connector side and the second connector side are rotated away from the first angular orientation in at least a first direction.

BRIEF DESCRIPTION OF THE DRAWINGS

FIG. 25 is a front exploded view of the elements shown in FIG. 24;

FIG. 26A is a rear view of an exemplary embodiment of a male connector ring that may form a portion of an exemplary male connector of a device case according to an exemplary embodiment;

FIG. 27 is an exploded view of an exemplary embodiment of a female connector.

FIG. 32 is a top perspective view of a male connector and a female connector according to an exemplary embodiment, the male connector and the female connector being shown facing away from one another;

FIG. 33 is a top perspective view of the male connector and the female connector of FIG. 32, the male connector and the female connector being shown facing toward one another;

FIG. 34 is a bottom perspective view of the male connector and the female connector of FIG. 33;

FIG. 35 is a top perspective exploded view of elements of the male connector of FIG. 32;

FIG. 36 is a top perspective exploded rending of the elements shown in FIG. 35;

FIG. 37 is a top perspective exploded view of elements of the female connector of FIG. 32;

FIG. 38 is a top perspective exploded rending of the elements shown in FIG. 37;

FIG. 39 is a side exploded view of the elements shown in FIG. 35 and the elements shown in FIG. 36;

FIG. 40 is a side perspective exploded view of the elements shown in FIG. 39;

FIG. 41 is a top perspective exploded view of the elements shown in FIG. 39;

FIG. 44 is a side view of the male connector and the female connector of FIG. 32, the male connector and the female connector being shown oriented so as to disengage one another

DETAILED DESCRIPTION OF THE DRAWINGS

The figures constitute a part of this specification and include illustrative embodiments of the present invention and illustrate various objects and features thereof. The drawings shown are not necessarily to scale, with emphasis instead generally being placed upon illustrating the principles of the present invention. Further, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Throughout the specification, the following terms take the meanings explicitly associated herein, unless the context clearly dictates otherwise. The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a", "an", and "the" include plural references. The meaning of "in" includes "in" and "on".

It is understood that each specific example described below is presented to illustrate general inventive principle(s) of the present invention in accordance with at least some embodiments and should not be viewed as being limiting. Specifically, for example while examples below identify a particular mobile device of a particular type, the present invention is not limited to such particular device and can be equally utilized in other similarly suitable devices of other types. For example, in some embodiments, an exemplary inventive multifunctional connection system can be utilized for mobile devices manufactured by other companies such as Samsung, Motorola, Blackberry, Nokia, LG, ZTE, and etc. For example, in some embodiments, an exemplary inventive multifunctional connection system can be utilized for an electronic device selected from a group of, but not limited to: a tablet, a smartphone, a laptop, a wearable electronic device (e.g., activity tracker), a portable music player, and any other similarly suitable device.

Figure 1:
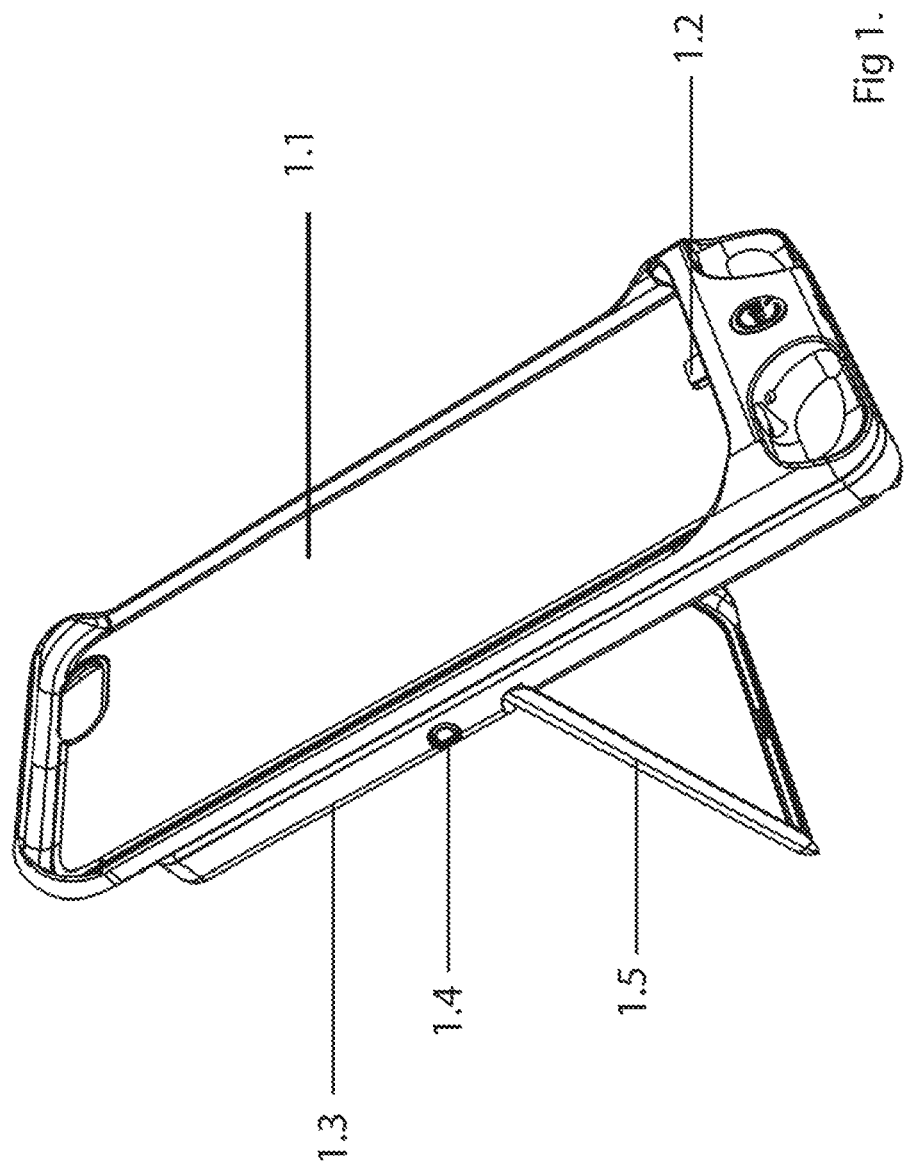
FIG. 1 is a front perspective view of a device case and a battery case according to an exemplary embodiment.

FIG. 1 shows a front perspective view of an exemplary embodiment of a device case 1.1 for a mobile device and a mating battery case 1.3. In some embodiments, the device case 1.1 is configured to engage a mobile phone. In some embodiments, the case is configured to engage a mobile phone such as the mobile phones commercialized by Apple, Inc. of Cupertino, Calif. under the trademarks IPHONE 6 and IPHONE 6S. In some embodiments, the case includes a connector 1.2. In some embodiments, the connector 1.2 is a connector of the type commercialized by Apple, Inc. of Cupertino, Calif. under the trademark LIGHTNING. In some embodiments, the connector 1.2 is configured to be movable forward and backward (i.e., toward and away from the main body of the case 1.1). In some embodiments, the device case 1.1 connects to a battery case 1.3. In some embodiments, the connector 1.2 creates an electrical connection between the battery case 1.3 and a mobile device that is stored in the device case 1.1. In some embodiments, the device case 1.1 includes a universal serial bus ("USB") port. In some embodiments, the connector 1.2 creates an electrical connection between a mobile device that is stored in the device case 1.1 and the USB port. In some embodiments, the device case 1.1 includes a multifunction power and battery life indicator 1.4. In some embodiments, the indicator 1.4 can be actuated by a user to activate and deactivate flow of electricity to a mobile device that is stored in the device case 1.1 from the battery case 1.3. In some embodiments, the indicator 1.4 indicates a charge level of the battery case 1.3 through illumination. In some embodiments, the battery case 1.3 includes a media leg 1.5. In some embodiments, the media leg 1.5 can be selectively extended from the battery case 1.3 or folded against the battery case 1.3. In some embodiments, the media leg 1.5 is configured to be able to break away from the battery case 1.3 and reattach to battery case 1.3 without damage so as to eliminate the possibility of damage from user interaction.

Figure 2:
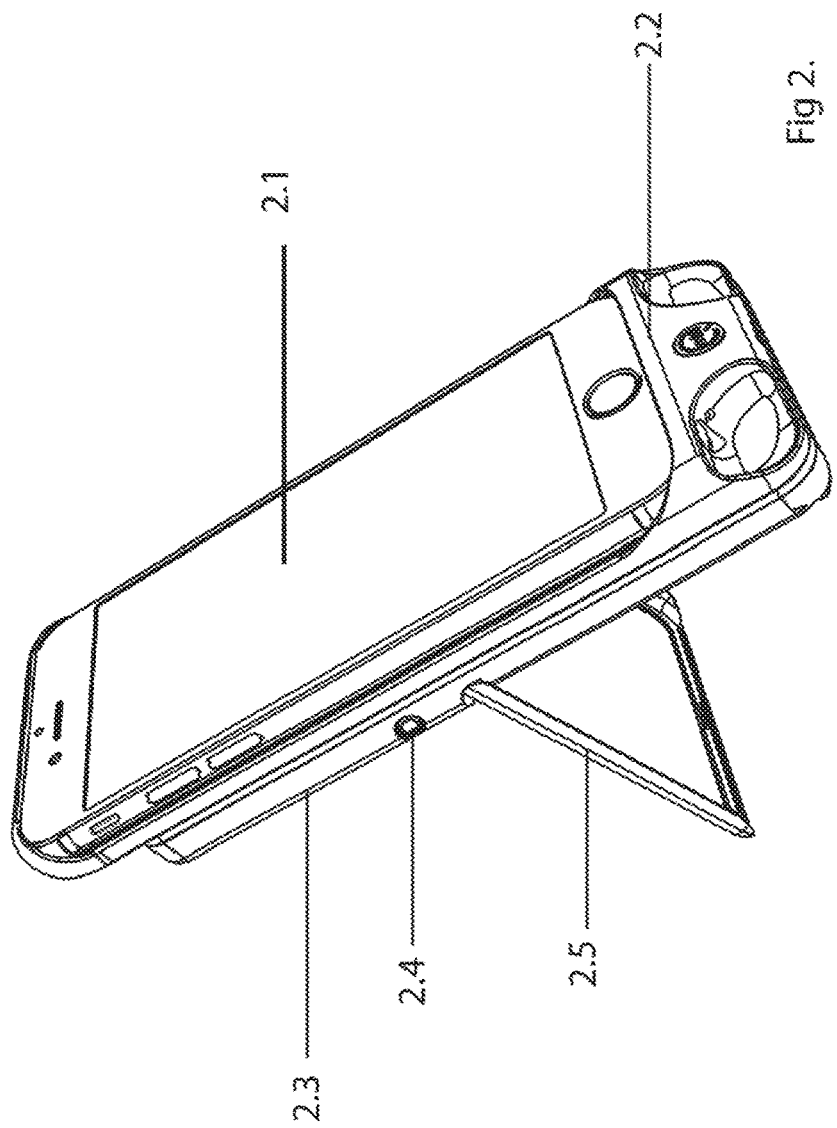
FIG. 2 is a front perspective view of a device case and a battery case according to an exemplary embodiment, the device case engaging a mobile device.

FIG. 2 shows a front perspective view of an exemplary embodiment of a device case 2.2 for a mobile device and a mating battery case 2.3. In the view shown in FIG. 2, the device case 2.2 is engaged with a mobile device 2.1, and is engaged with the battery case 2.3. In some embodiments, the battery case 2.3 includes an indicator 2.4 that is substantially similar to the indicator 1.4 described above with reference to FIG. 1. In some embodiments, the battery case 2.3 includes a leg 2.5 that is substantially similar to the leg 1.5 described above with reference to FIG. 1.

Figure 3:
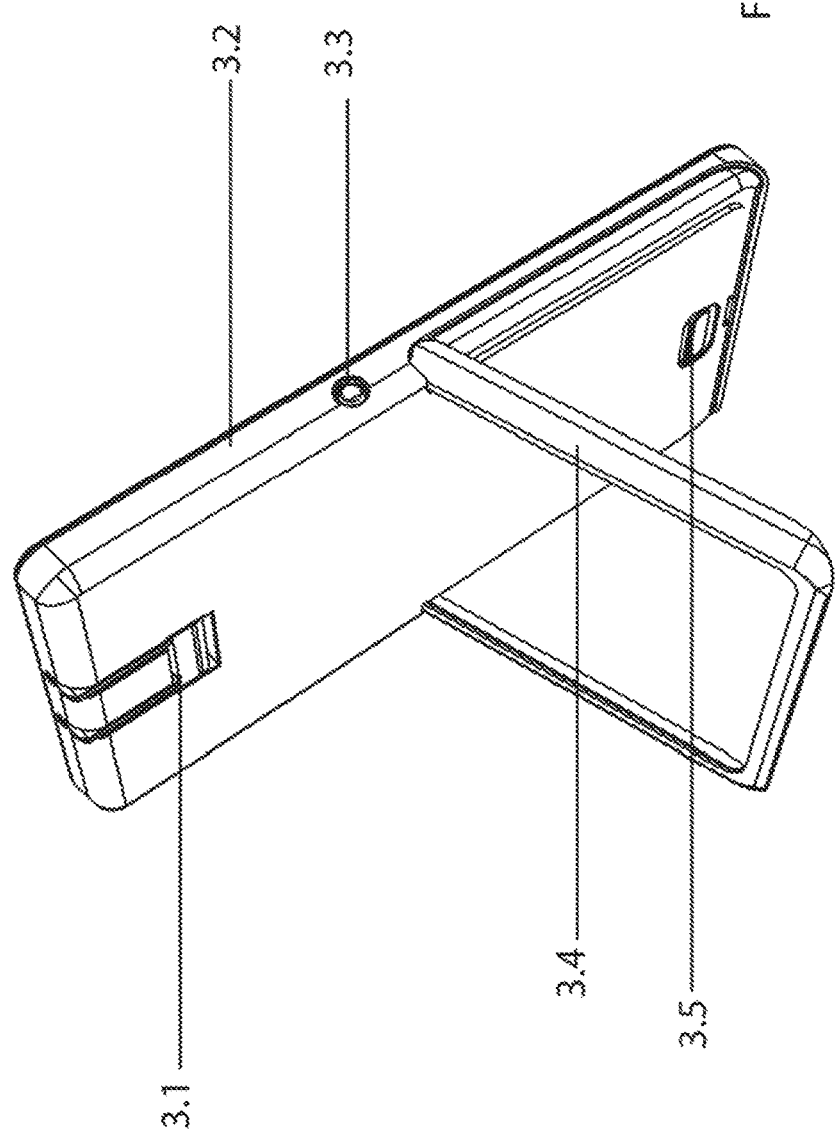
FIG. 3 is a rear perspective view of a battery case according to an exemplary embodiment.

FIG. 3 shows a rear perspective view of an exemplary embodiment of a battery case 3.2. In some embodiments, the battery case 3.2 includes a selectively deployable and retractable AC adapter 3.1. FIG. 3 shows the AC adapter 3.1 in the retracted position. In some embodiments, the battery case 3.2 includes an internal battery. In some embodiments, the AC adapter 3.1 provides for high voltage charging of the internal battery of the battery case 3.2 with input voltage ranging from 110 V to 240 V and DC output ranging from 3 V to 4.5 V. In some embodiments, the battery case 3.2 includes an indicator 3.3 that is substantially similar to the indicator 1.4 described above with reference to FIG. 1. In some embodiments, the battery case 3.2 includes a leg 3.4 that is substantially similar to the leg 1.5 described above with reference to FIG. 1. In some embodiments, the battery case 3.2 includes a latch 3.5 that is configured to selectively lock or unlock the leg 3.4. In some embodiments, the latch 3.5 is mechanical. In some embodiments, the latch 3.5 is magnetic.

Figure 4:
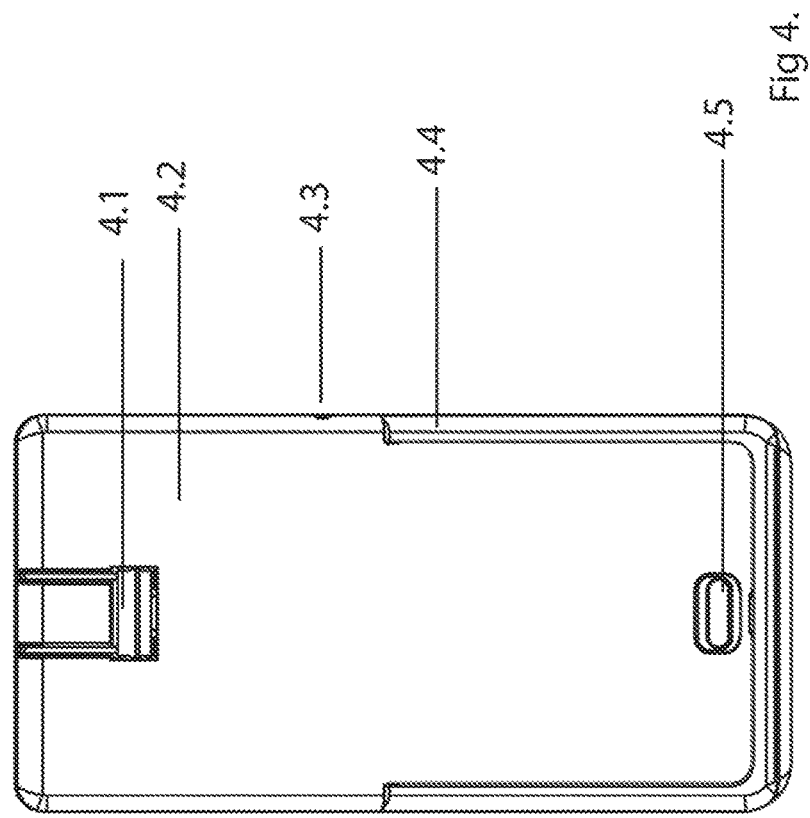
FIG. 4 is a rear view of a battery case according to an exemplary embodiment.

FIG. 4 shows a rear view of an exemplary embodiment of a battery case 4.2. In some embodiments, the battery case 4.2 includes an AC adapter 4.1. In some embodiments, the AC adapter 4.1 is substantially similar to the AC adapter 3.1 described above with reference to FIG. 3. In some embodiments, when the AC adapter 4.1 is in the retracted position, no voltage can be applied to or discharged from the prongs of the AC adapter 4.1. In some embodiments, the battery case 4.2 includes an indicator 4.3 that is substantially similar to the indicator 1.4 described above with reference to FIG. 1. In some embodiments, the battery case 4.2 includes a leg 4.4 that is substantially similar to the leg 1.5 described above with reference to FIG. 1. FIG. 4 shows the leg 4.4 in the retracted position. In some embodiments, the battery case 4.2 includes a latch 4.5 that is substantially similar to the latch 3.5 described above with reference to FIG. 3.

Figure 5:
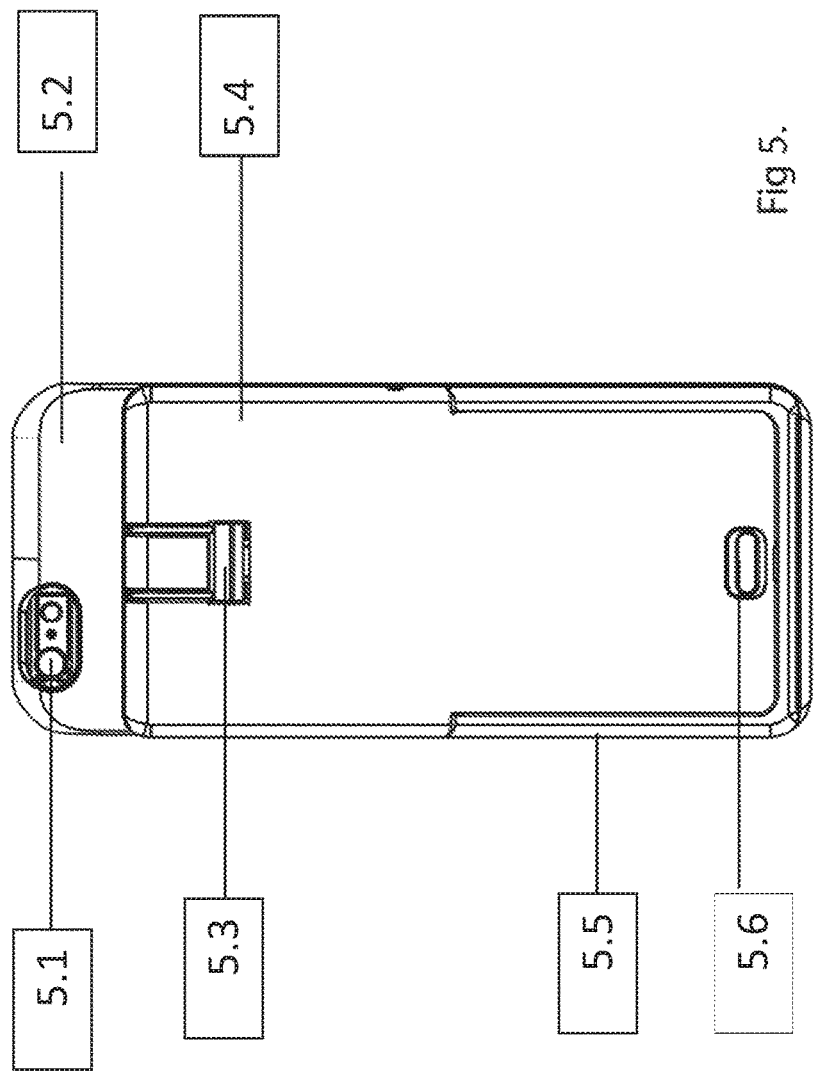
FIG. 5 is a rear view of a battery case and a device case according to an exemplary embodiment.

FIG. 5 shows a rear view of an exemplary embodiment of a battery case 5.4 that is engaged to a device case 5.2, which is engaged to a mobile device 5.1. In some embodiments, the device case 5.2 includes at least one hole 5.1 providing access to a camera and flash area of a mobile device. It will be apparent to those of skill in the art that the configuration of the hole 5.1 is only exemplary and that other embodiments of a device case 5.2 may be configured to engage other types of mobile devices, and, as a result, may include at least one hole 5.1 that is positioned differently, sized differently, etc. In some embodiments, the battery case 5.4 includes an AC adapter 5.3 that is substantially similar to the AC adapter 4.1 described above with reference to FIG. 4. In some embodiments, the battery case 5.4 includes a leg 5.5 that is substantially similar to the leg 1.5 described above with reference to FIG. 1. In some embodiments, the battery case 5.4 includes a latch 4.6 that is substantially similar to the latch 3.5 described above with reference to FIG. 3.

Figure 6:
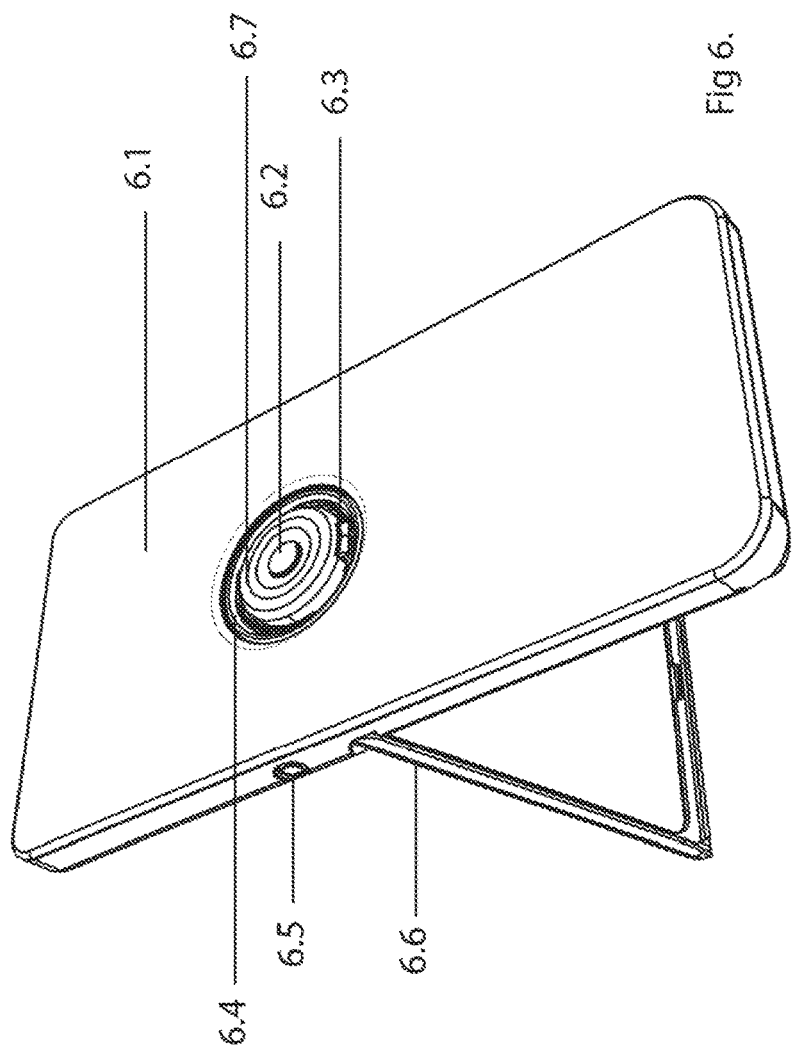
FIG. 6 is a front perspective view of a battery case according to an exemplary embodiment.

FIG. 6 shows a perspective view of an exemplary embodiment of a battery case 6.1. In some embodiments, the battery case includes a rotatable female connector portion 6.7, which includes a female connector 6.2 that provides a portion of a DC power output when the female connector 6.2 is mated with a male connector (to be described hereinafter). In some embodiments, the connector portion 6.7 also includes a mechanical locking latch 6.3, which is supported by integrated magnets within the battery case 6.1. In some embodiments, the latch 6.3 is configured such that a device case that is engaged with the battery case 6.1 is secured to the battery case 6.1 when at at least one rotational orientation with respect to the battery case 6.1 and is free to be removed from the battery case 6.1 when at another at least one rotational orientation with respect to the battery case 6.1. In some embodiments, the connector portion 6.7 also includes an outer DC contact 6.4 that provides a further portion of a DC power output when the contact 6.4 is mated with a corresponding connector of a device case (to be described hereinafter). In some embodiments, the battery case 6.1 includes an indicator 6.5 that is substantially similar to the indicator 1.4 described above with reference to FIG. 1. In some embodiments, the battery case 6.1 includes a leg 6.6 that is substantially similar to the leg 1.5 described above with reference to FIG. 1.

Figure 7:
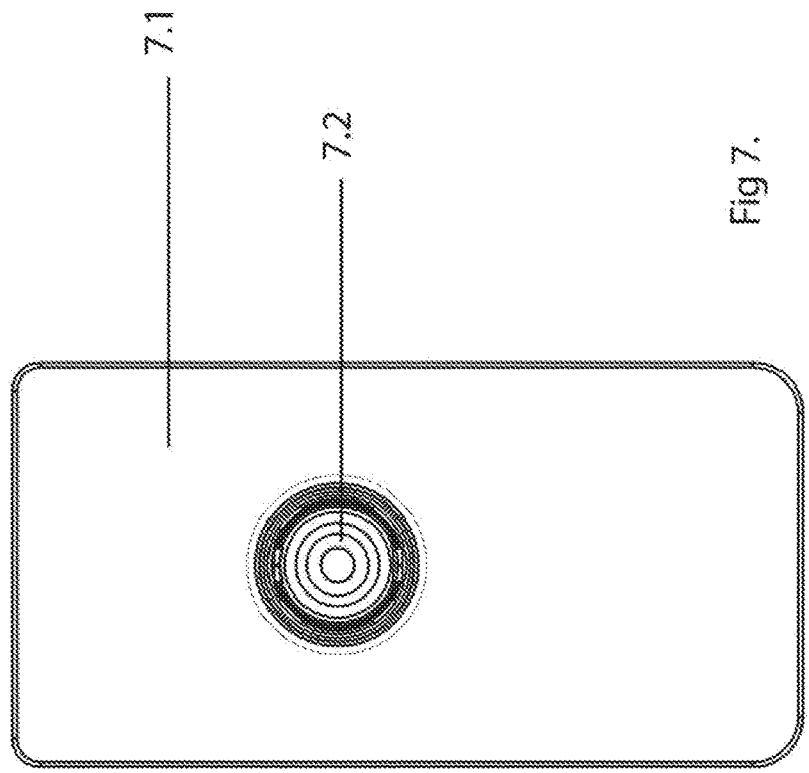
FIG. 7 is a front view of a battery case according to an exemplary embodiment.

FIG. 7 shows a front view of an exemplary embodiment of a battery case 7.1. In some embodiments, the battery case 7.1 includes a rotatable female connector portion 7.2 that is substantially similar to the rotatable female connector portion 6.7 described above with reference to FIG. 6 and includes substantially the same elements.

Figure 8:
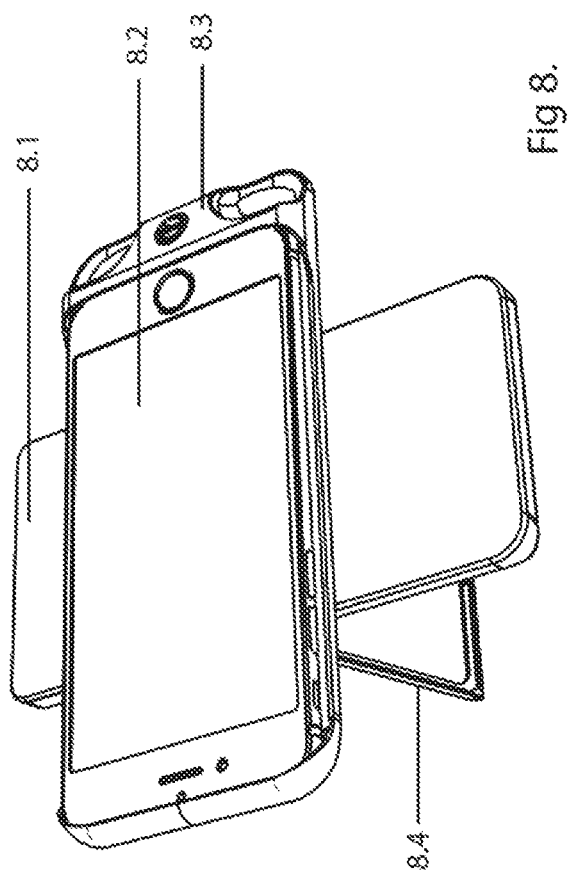
FIG. 8 is a front perspective view of a device case and a battery case according to an exemplary embodiment, the device case engaging a mobile device and being rotated with respect to the battery case to a media viewing position.

FIG. 8 shows a perspective view of an exemplary embodiment of a battery case 8.1 that is engaged with an exemplary embodiment of a device case 8.3, which is engaged with a mobile device 8.2. In the configuration shown in FIG. 8, the device case 8.3 is rotated by 90 degrees with respect to the battery case 8.1. In some embodiments, the configuration shown in FIG. 8 is suitable for viewing media on the mobile device 8.2. In some embodiments, the device case 8.3 includes a connector portion that is substantially similar to the rotatable female connector portion 6.7 described above with reference to FIG. 6, which is configured to secure the device case 8.3 to the battery case 8.1 when these elements are oriented with respect to one another as shown in FIG. 8. In some embodiments, the battery case 8.1 includes a leg 8.4 that is substantially similar to the leg 1.5 described above with reference to FIG. 1. FIG. 8 shows the leg 8.4 in the extended position such that media may be viewed on the mobile device 8.2 without holding the mobile device 8.2.

Figure 9:
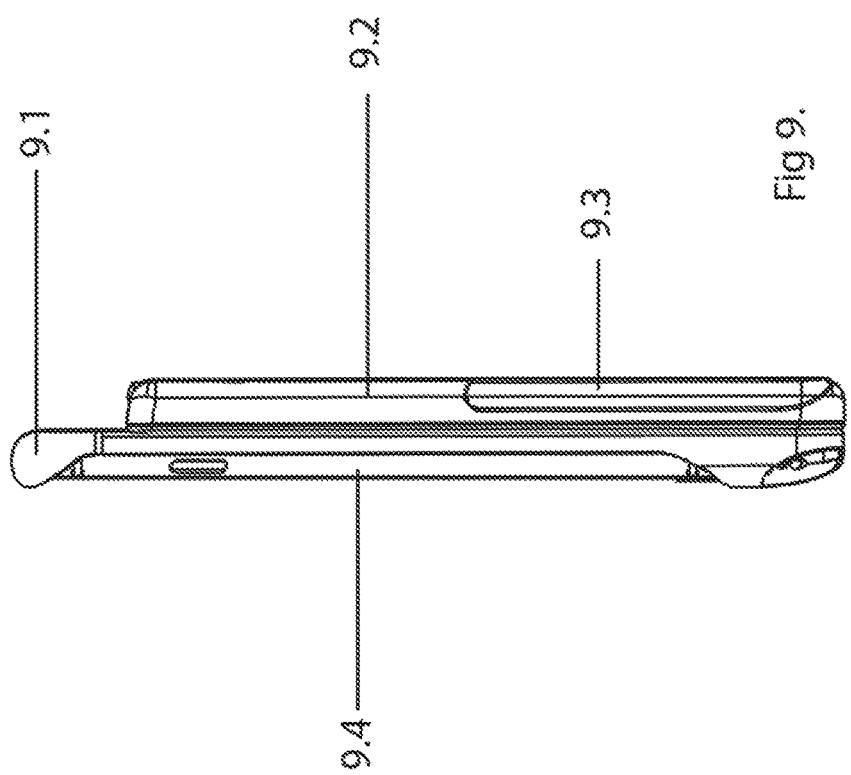
FIG. 9 is a side view of a device case and a battery case according to an exemplary embodiment.

FIG. 9 shows a side view of an exemplary embodiment of a device case 9.1 that is engaged to a battery case 9.2. In the view shown in FIG. 9, the device case is also engaged to a mobile device 9.4. In some embodiments, the battery case 9.2 includes a leg 9.3 that is substantially similar to the leg 1.5 described above with reference to FIG. 1. FIG. 9 shows the device case 9.1 rotated by 0 degrees with respect to the battery case 9.2 and the leg 9.3 in the retracted position. In some embodiments, when the various elements are positioned as shown in FIG. 9, the mobile device 9.4, the device case 9.1, and the battery case 9.2 are compact and may be easily stored.

Figure 10:
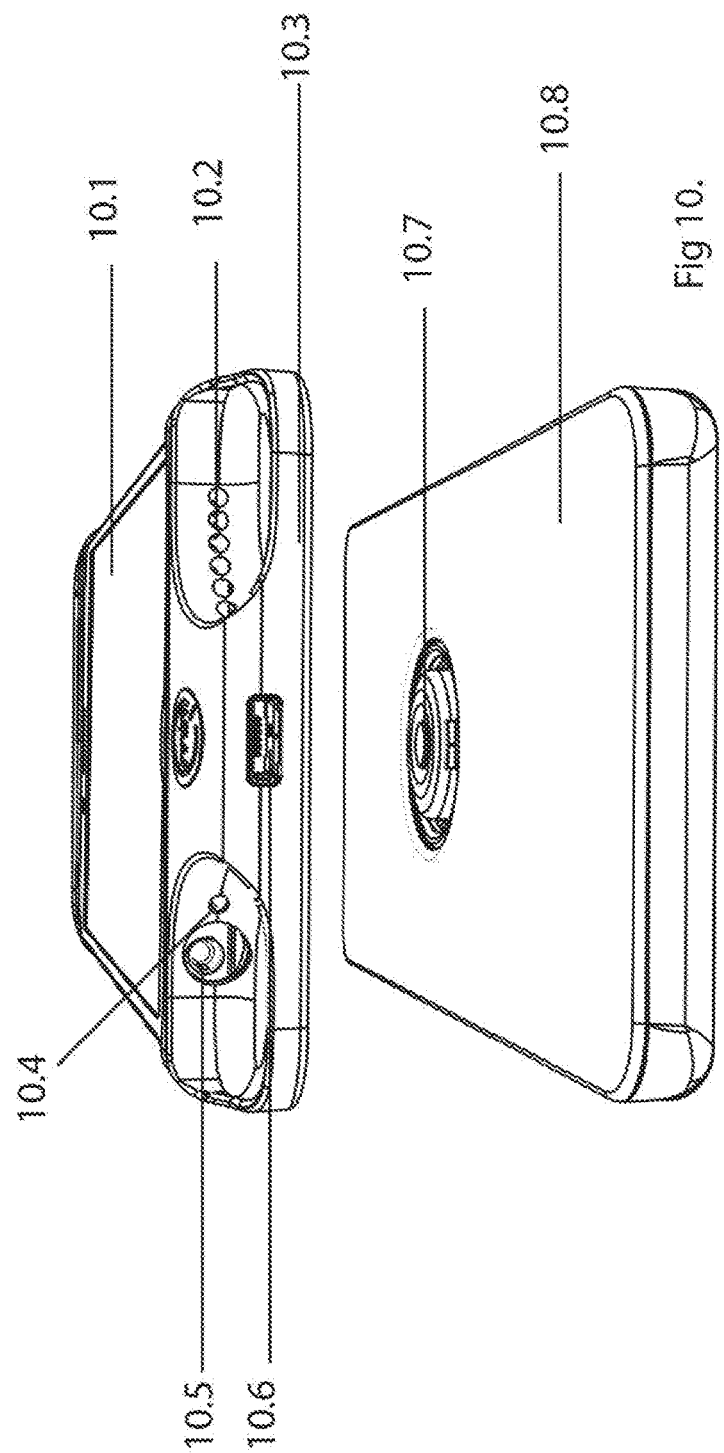
FIG. 10 is a bottom perspective view of a device case and a battery case according to an exemplary embodiment.

FIG. 10 shows a bottom perspective view of an exemplary embodiment of a device case 10.3 and a battery case 10.8. In the view shown in FIG. 10, the device case 10.3 is engaged with a mobile device 10.1 and is disengaged from the battery case 10.8. In some embodiments, the device case 10.3 includes at least one hole 10.2 providing access to speakers of the mobile device 10.1. In some embodiments, the device case 10.3 includes at least one hole 10.4 providing access to a microphone of the mobile device 10.1. In some embodiments, the device case 10.3 includes at least one hole 10.5 providing access to a headphone jack of the mobile device 10.1. It will be apparent to those of skill in the art that the configuration of the at least one hole 10.2, the at least one hole 10.4, and the at least one hole 10.5 shown in FIG. 10 are appropriate for a mobile device such as the mobile device commercialized by Apple Inc. of Cupertino, Calif. under the trademark IPHONE 6, and that, in other embodiments, the device case 10.3 may include at least one differently positioned hole suitable for the elements of a different type of mobile device. In some embodiments, the device case 10.3 includes a USB port 10.6. In some embodiments, the USB port 10.6 is configured to charge the mobile device 10.1 (e.g., via a connected USB power cable) when the device case 10.3 is disengaged from the battery case 10.8. In some embodiments, the USB port 10.6 is configured to charge the mobile device 10.1 (e.g., via a connected USB power cable) as a first priority, and then, when the device case 10.3 is engaged with the battery case 10.8, to charge the battery case 10.8. In some embodiments, the USB port 10.6 is configured to transfer data to and from the mobile device 10.1 such that the mobile device 10.1 does not need to be removed from the device case 10.3 in order to transfer data to and from the phone via a wired connection. In some embodiments, the USB port 10.6 is configured to perform more than one of the above functions. In some embodiments, the battery case 10.8 includes a rotatable female connector portion 10.7 that is substantially similar to the rotatable female connector portion 6.7 described above with reference to FIG. 6 and includes substantially the same elements.

Figure 11:
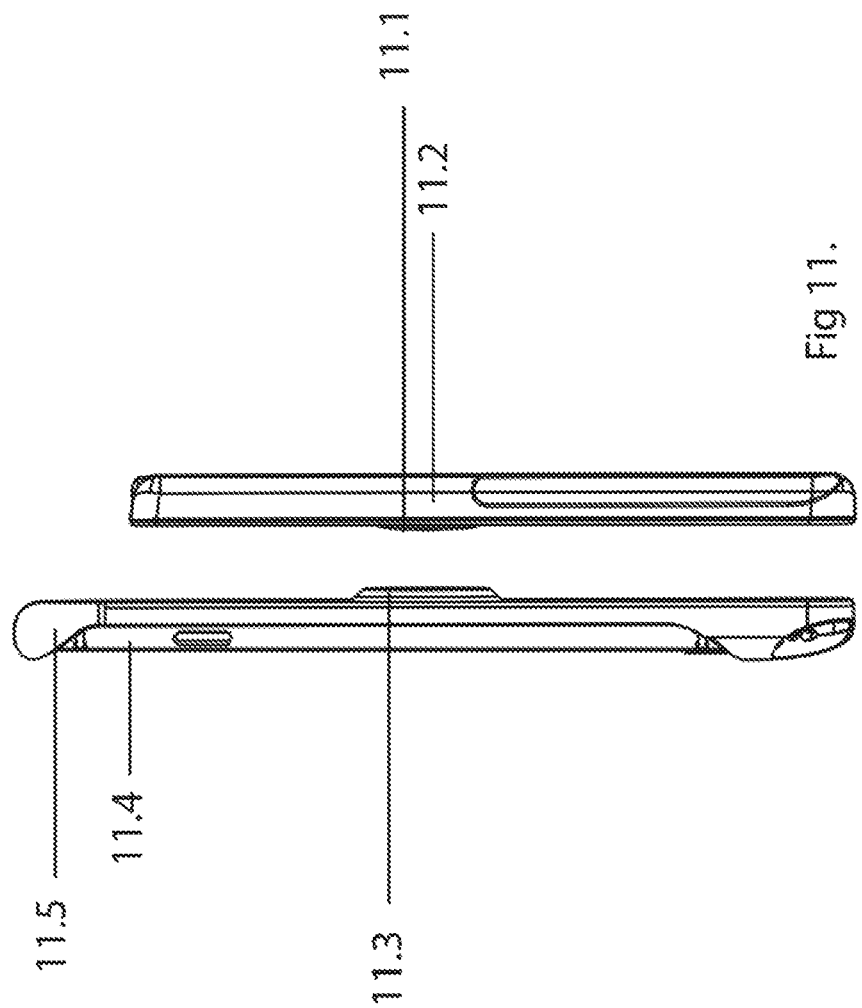
FIG. 11 is a side view of a device case and a battery case according to an exemplary embodiment.

FIG. 11 shows a side view of an exemplary embodiment of a device case 11.5 that is disengaged from an exemplary embodiment of a battery case 11.2. In the depiction of FIG. 11, the device case 11.5 is engaged to a mobile device 11.4. In some embodiments, the battery case 11.2 includes a rotatable female connector portion 11.1 that is substantially similar to the rotatable female connector portion 6.7 described above with reference to FIG. 6 and includes substantially the same elements. In some embodiments, the device case 11.5 includes a rotatable male connector portion 11.3 that is configured to removably engage the rotatable female connector portion 11.1 of the battery case 11.2 as will be described in greater detail hereinafter.

Figure 12:
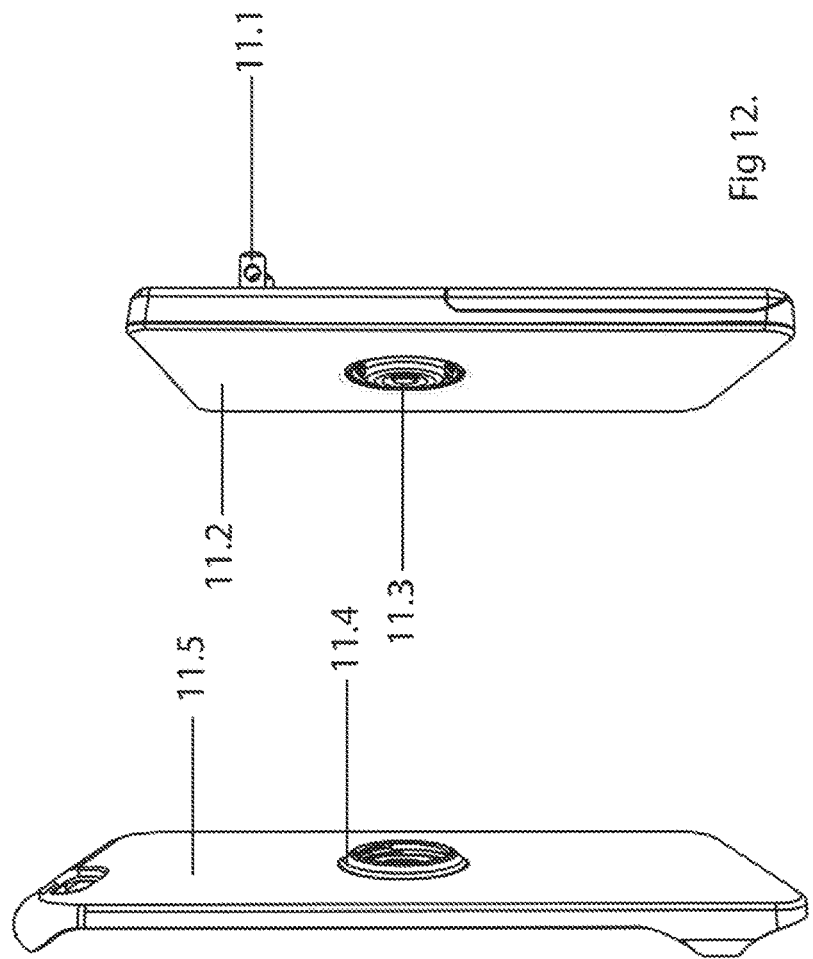
FIG. 12 is a side perspective view of a device case and a battery case according to an exemplary embodiment.

FIG. 12 shows a side perspective view of an exemplary embodiment of a device case 12.5 that is disengaged from an exemplary embodiment of a battery case 12.2. In some embodiments, the battery case 12.2 includes a rotatable female connector portion 12.3 that is substantially similar to the rotatable female connector portion 6.7 described above with reference to FIG. 6 and includes substantially the same elements. In some embodiments, the device case 12.5 includes a rotatable male connector portion 12.4 that is configured to removably engage the rotatable female connector portion 12.3 of the battery case 12.2 as will be described in greater detail hereinafter. In some embodiments, the battery case 12.2 includes an AC adapter 12.1 that is substantially similar to the AC adapter 4.1 described above with reference to FIG. 4. As depicted in FIG. 12, the AC adapter 12.1 is in its deployed position.

Figure 13:
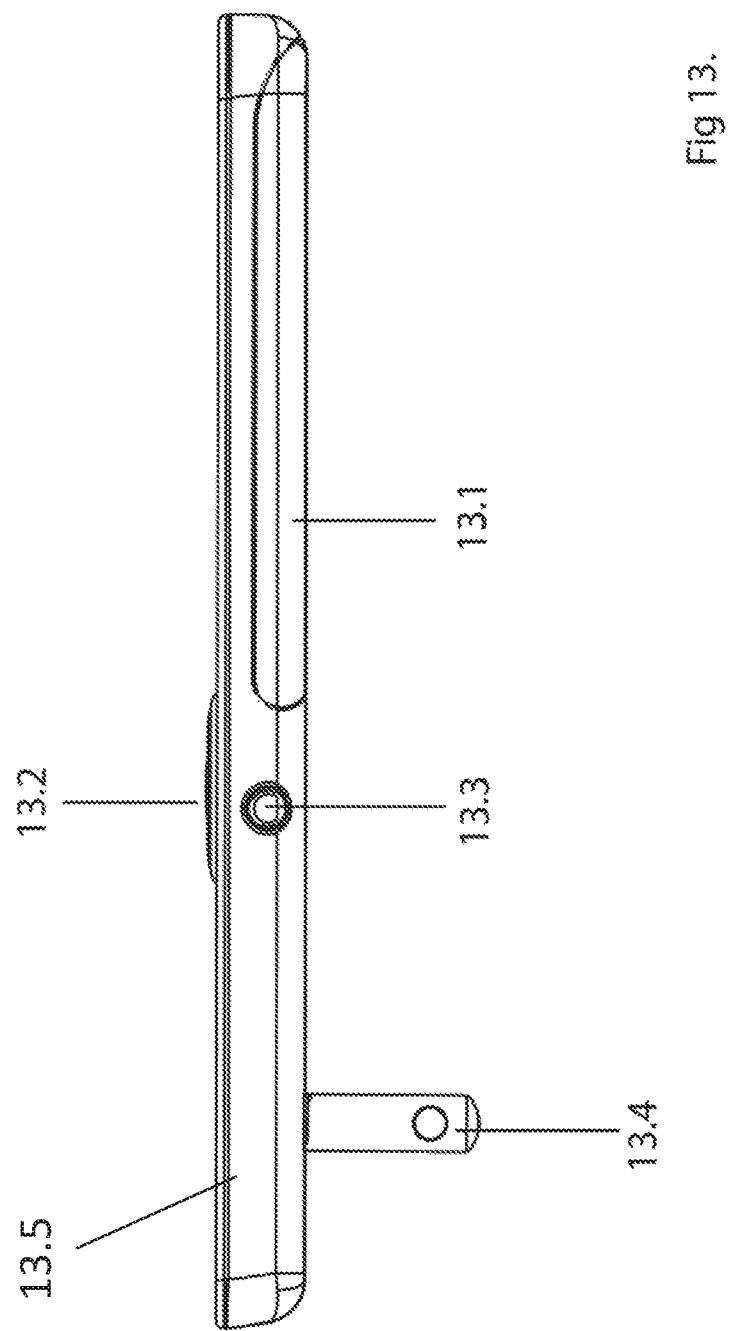
FIG. 13 is a side view of a battery case according to an exemplary embodiment.

FIG. 13 shows a side view of an exemplary embodiment of a battery case 13.5. In some embodiments, the battery case 13.5 includes a leg 13.1 that is substantially similar to the leg 1.5 described above with reference to FIG. 1. FIG. 13 shows the leg 13.1 in its retracted position. In some embodiments, the battery case 13.5 includes a rotatable female connector portion 13.2 that is substantially similar to the rotatable female connector portion 6.7 described above with reference to FIG. 6 and includes substantially the same elements. In some embodiments, the battery case 13.5 includes an indicator 13.3 that is substantially similar to the indicator 1.4 described above with reference to FIG. 1. In some embodiments, the battery case 13.5 includes an AC adapter 13.4 that is substantially similar to the AC adapter 4.1 described above with reference to FIG. 4. As depicted in FIG. 13, the AC adapter 13.4 is in its deployed position.

Figure 14:
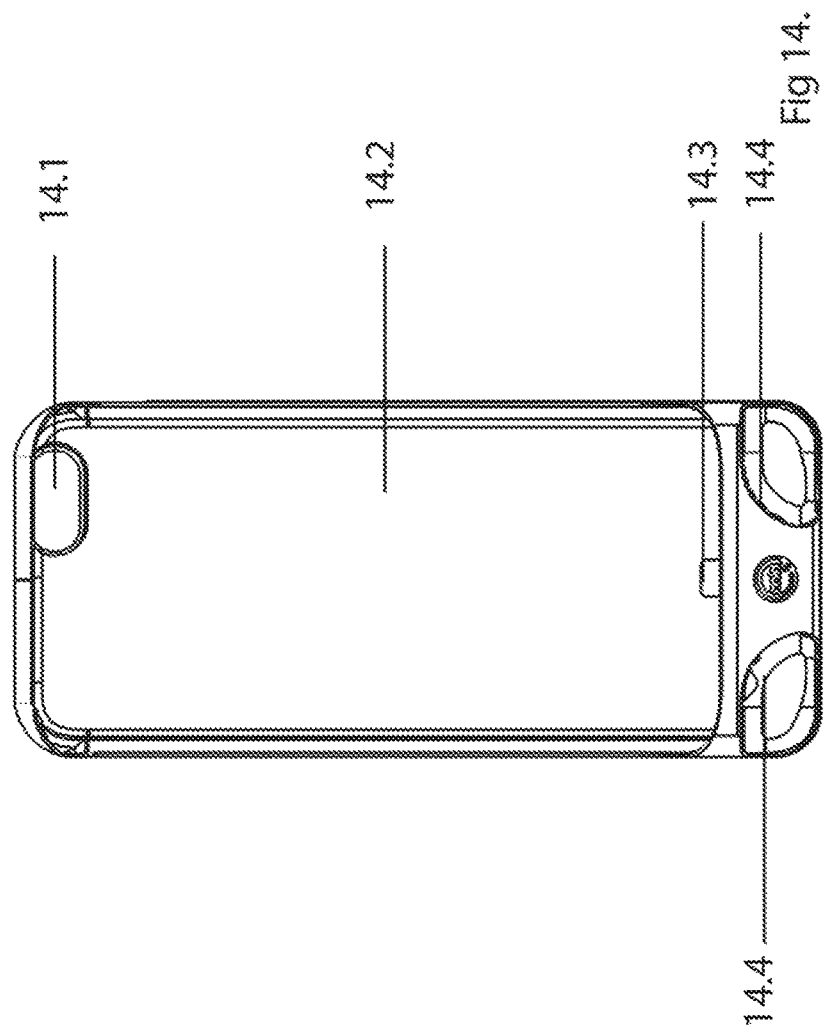
FIG. 14 is a front view of a device case according to an exemplary embodiment.

FIG. 14 shows a front view of an exemplary embodiment of a device case 14.2 that is not engaged to a mobile device. In some embodiments, the device case 14.2 includes at least one hole 14.1 providing access to a camera and flash of a mobile device. In some embodiments, the device case 14.2 includes at least one hole 14.3 providing access to a microphone and headphone port of a mobile device. In some embodiments, the device case 14.2 includes at least one hole 14.4 providing access to a speaker of a mobile device. It will be apparent to those of skill in the art that the configuration of the at least one hole 14.1, the at least one hole 14.3, and the at least one hole 14.4 shown in FIG. 14 are appropriate for a mobile device such as the mobile device commercialized by Apple Inc. of Cupertino, Calif. under the trademark IPHONE 6, and that, in other embodiments, the device case 10.3 may include at least one differently positioned hole suitable for the elements of a different type of mobile device.

Figure 15:
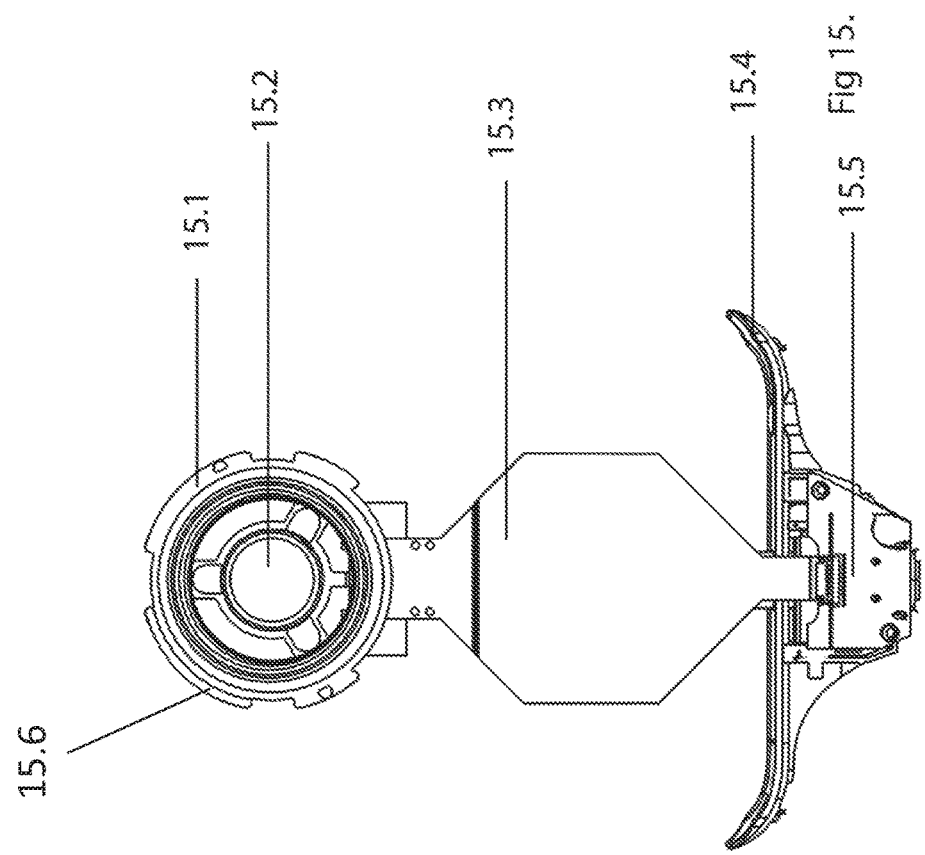
FIG. 15 is a rear view of a male connector subassembly of a device case according to an exemplary embodiment.

FIG. 15 shows a rear view of a male connector sub-assembly 15.6 that may be located internal to a device case (e.g., the device case 14.2 of FIG. 14). In some embodiments, the male connector sub-assembly 15.6 includes an outer ring 15.1. In some embodiments, the outer ring 15.1 includes ramps configured to provide for alignment, engagement, and disengagement with a mating female connector. In some embodiments, the male connector sub-assembly 15.6 includes a center DC contact 15.2. In some embodiments, the center DC contact 15.2 is configured to receive power from a center DC contact of a mating female connector. In some embodiments, the male connector sub-assembly includes a USB port 15.5. In some embodiments, the USB port 15.5 is configured to charge a mobile device that is connected thereto as discussed above with reference to the USB port 10.6 described above with reference to FIG. 10. In some embodiments, the male connector sub-assembly 15.6 includes a flex PCB interface 15.3. In some embodiments, the flex PCB interface 15.3 provides an electrical connection between the center DC contact 15.2 and the USB port 15.5. In some embodiments, the male connector sub-assembly 15.6 includes a stopper insert 15.4 that is configured to form a portion of a device case of which the male connector sub-assembly 15.6 forms a part. In some embodiments, the stopper insert 15.4 houses the USB port 15.5. In some embodiments, the stopper insert 15.4 houses a connector as will be described hereinafter with reference to FIG. 17. In some embodiments, the stopper insert 15.4 includes areas providing for access to a speaker, a headphone port, and a microphone of a mobile device, as described above with reference to FIG. 10.

Figure 16:
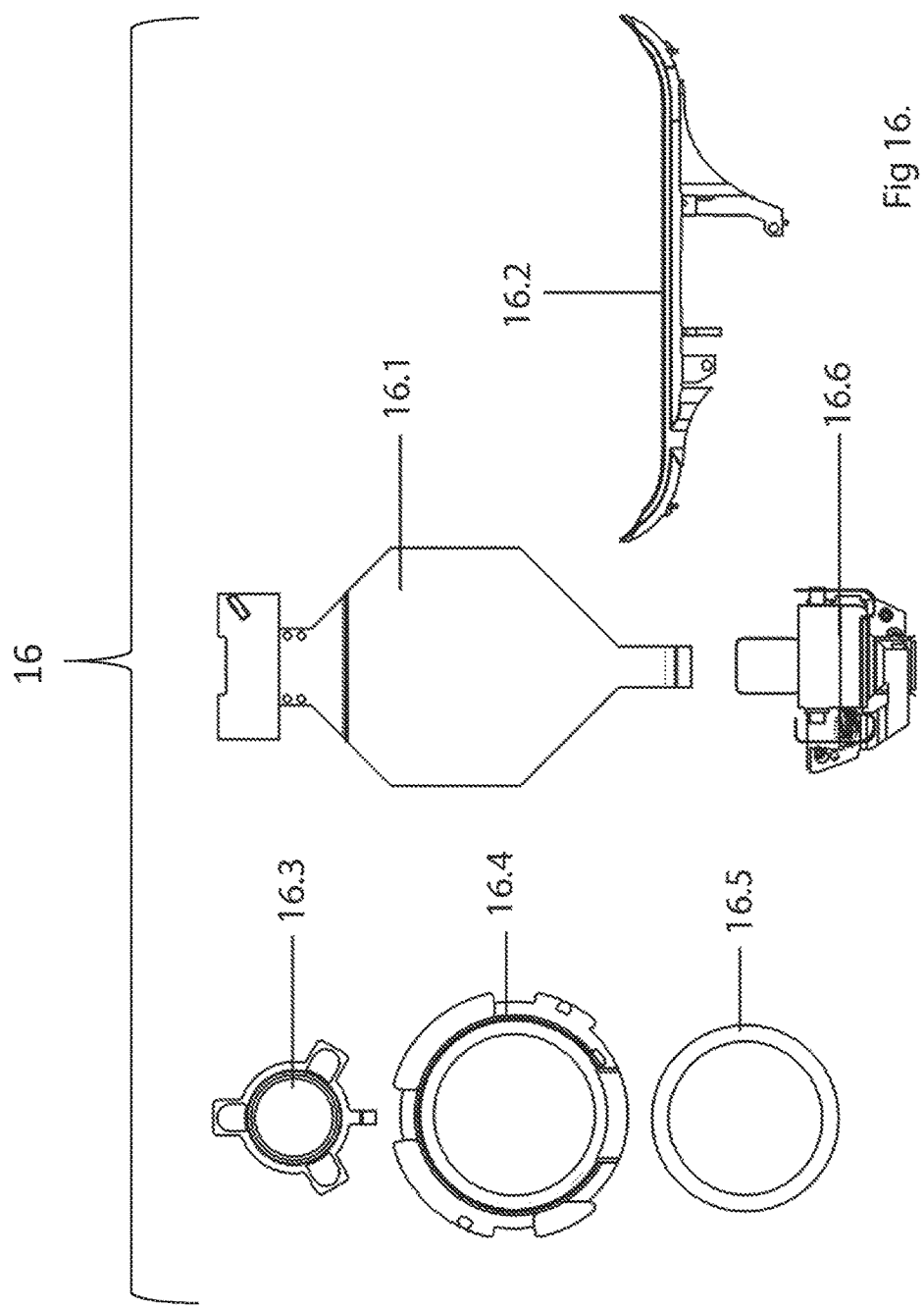
FIG. 16 is an exploded view of components of the subassembly of FIG. 15.

FIG. 16 shows an exploded view of an exemplary embodiment of a male connector subassembly 16. In some embodiments, the exemplary male connector subassembly is substantially similar to the male connector subassembly 15.6 of FIG. 15. In some embodiments, the male connector subassembly 16 includes a flex PCB interface 16.1 that is substantially similar to the flex PCB interface 15.3 described above with reference to FIG. 15. In some embodiments, the male connector subassembly 16 includes a stopper insert 16.2 that is substantially similar to the stopper insert 15.4 described above with reference to FIG. 15. In some embodiments, the male connector subassembly 16 includes a center DC contact 16.3 that is substantially similar to the center DC contact 15.2 described above with reference to FIG. 15. In some embodiments, the male connector subassembly 16 includes an outer ring 16.4 that includes ramps configured to provide for alignment, engagement, and disengagement with a mating female connector. In some embodiments, the exemplary male connector subassembly 16 includes a flush ring 16.5 that is configured to retain the center DC contact 16.3 and the outer ring 16.4 in flush contact with a power connection of the flex PCB interface 16.1.

Figure 17:
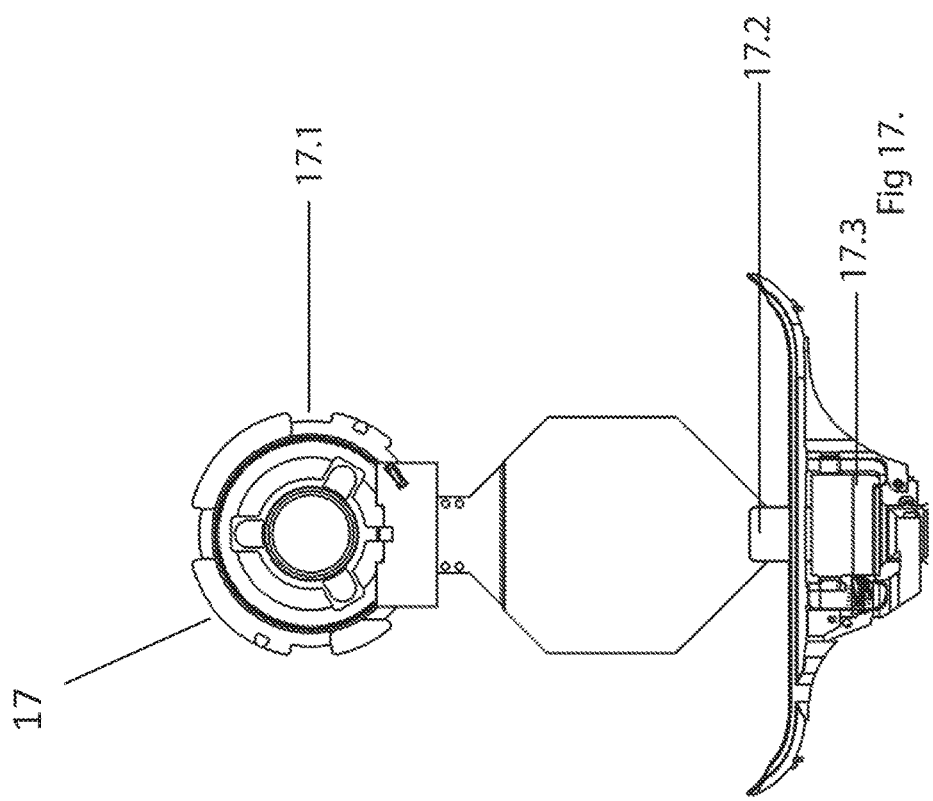
FIG. 17 is a rear view of the subassembly of FIG. 15.

FIG. 17 shows a front view of an exemplary embodiment of a male connector subassembly 17 that may be located internal to a device case (e.g., the device case 14.2 of FIG. 14). In some embodiments, the male connector subassembly 17 and its components substantially similar to the male connector subassembly 15.6 described above with reference to FIG. 15 other than as will be described hereinafter. In some embodiments, the male connector subassembly 17 includes a connector stack 17.1 including a center DC contact, an outer ring, and a flush ring, as described above with reference to FIG. 16. In some embodiments, the male connector subassembly 17 includes a connector 17.2. In some embodiments, the connector 17.2 is a connector of the type commercialized by Apple, Inc. of Cupertino, Calif. under the trademark LIGHTNING. In some embodiments, the male connector subassembly 17 some embodiments, the connector 1.2 includes an articulating housing 17.3 that is configured to allow the connector 17.2 to be movable forward and backward (i.e., toward and away from the main body of the case 1.1). In some embodiments, such allowable motion eases engagement and disengagement with a mobile device. In some embodiments, the articulating housing 17.3 provides an electrical connection between the connector 17.2 and a USB port that is located within a device case within which the male connector subassembly 17 is installed. In some embodiments, the articulating housing 17.3 includes a gimbal spring.

Figure 18:
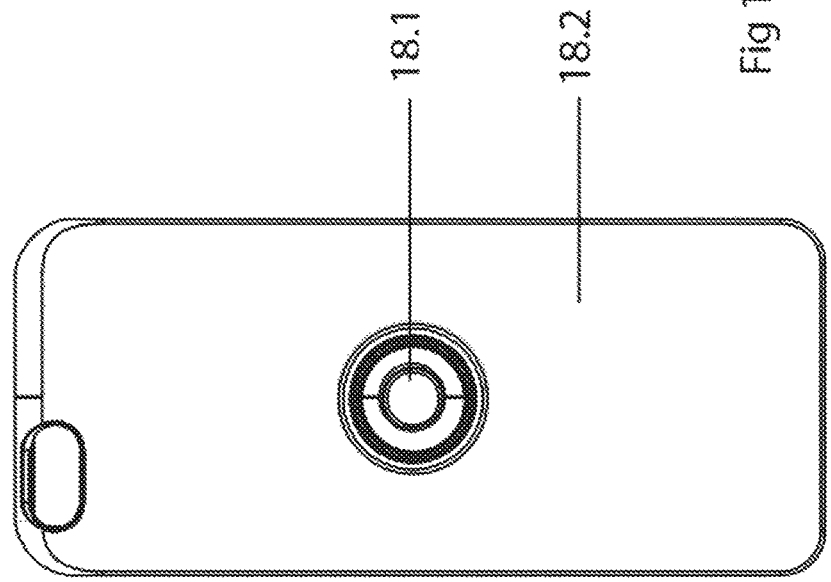
FIG. 18 is a rear view of a device case according to an exemplary embodiment.

FIG. 18 shows a rear view of an exemplary embodiment of a device case 18.2. In some embodiments, the device case 18.2 is substantially similar to the various other exemplary device cases described above other than as will be described hereinafter. In some embodiments, the device case 18.2 includes a rotatable male connector portion 18.1 that is configured to removably engage a rotatable female connector portion of a battery case. In some embodiments, the male connector portion 18.1 includes a center DC contact providing an electrical connection to a female connector and an outer ring including ramps configured to provide for alignment, engagement and disengagement with a female connector of a battery case.

Figure 19:
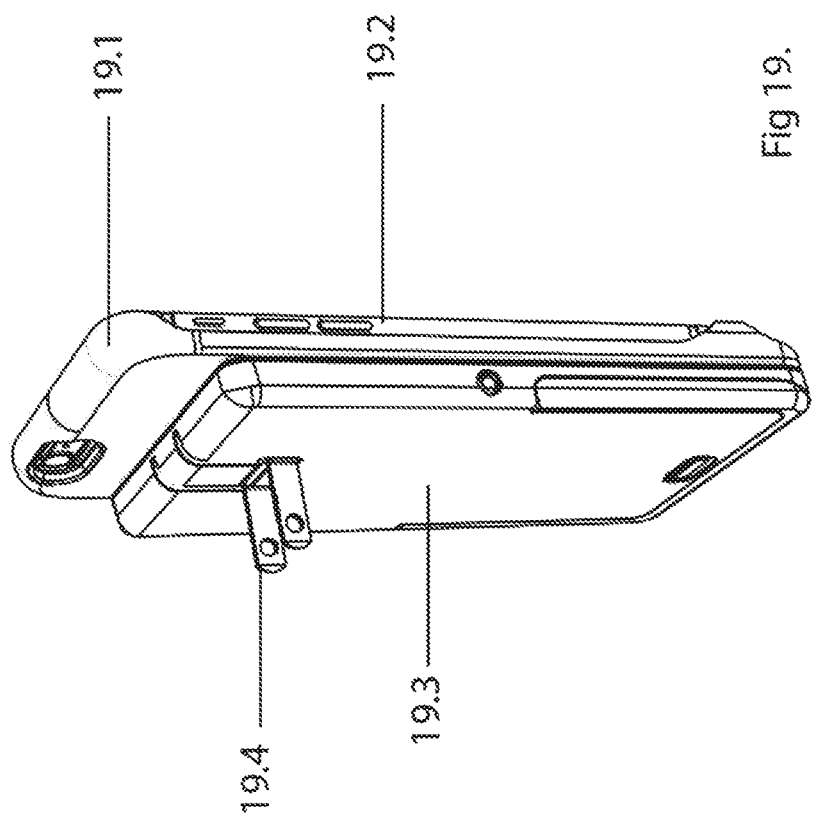
FIG. 19 is a rear perspective view of a device case and a battery case according to an exemplary embodiment.

FIG. 19 shows a side perspective view of an exemplary embodiment of a device case 19.1 that is engaged to an exemplary embodiment of a battery case 19.3. In some embodiments, the device case 19.1 and the battery case 19.3 are substantially similar to the various devices cases and battery cases, respectively, described above. As shown in FIG. 19, the device case 19.1 is engaged to a mobile device 19.2. In some embodiments, the battery case 19.3 includes an AC adapter 19.4 that is substantially similar to the AC adapter 4.1 described above with reference to FIG. 4. As depicted in FIG. 19, the AC adapter 19.4 is in its deployed position.

Figure 20:
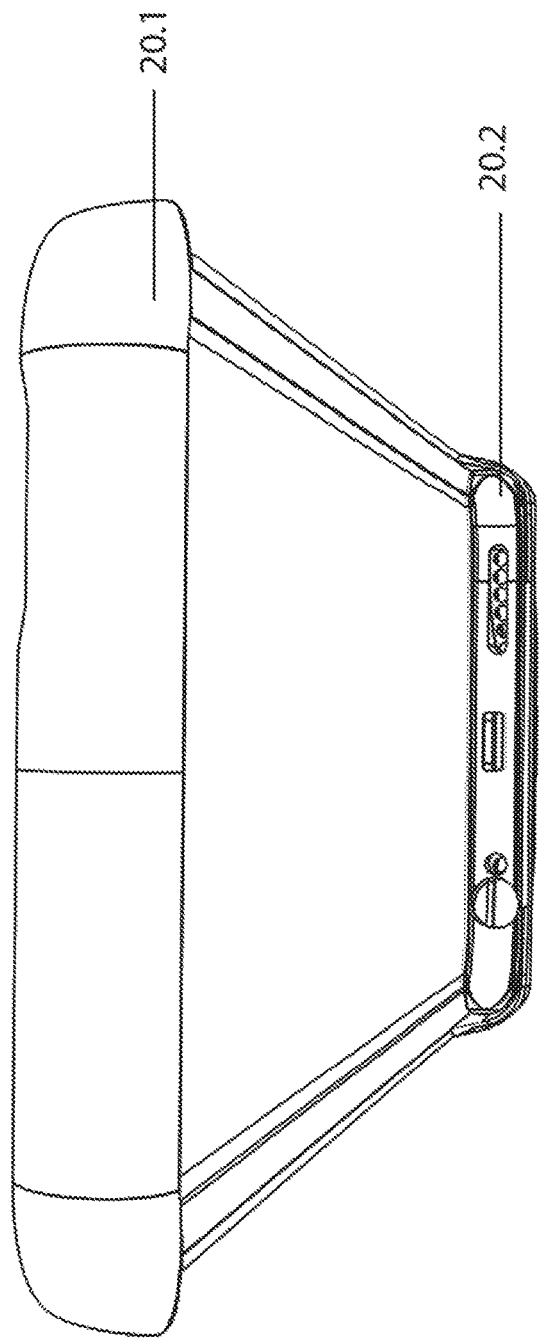
FIG. 20 is a top perspective view of a device case according to an exemplary embodiment.

FIG. 20 shows a top perspective view of an exemplary embodiment of a device case 20.1. In some embodiments, the device case 20.1 is substantially similar to the various other exemplary device cases described above other than as will be described hereinafter. In some embodiments, the device case 20.1 includes a stopper insert 20.2 that is substantially similar to the stopper insert 15.4 described above with reference to FIG. 15.

Figure 21:
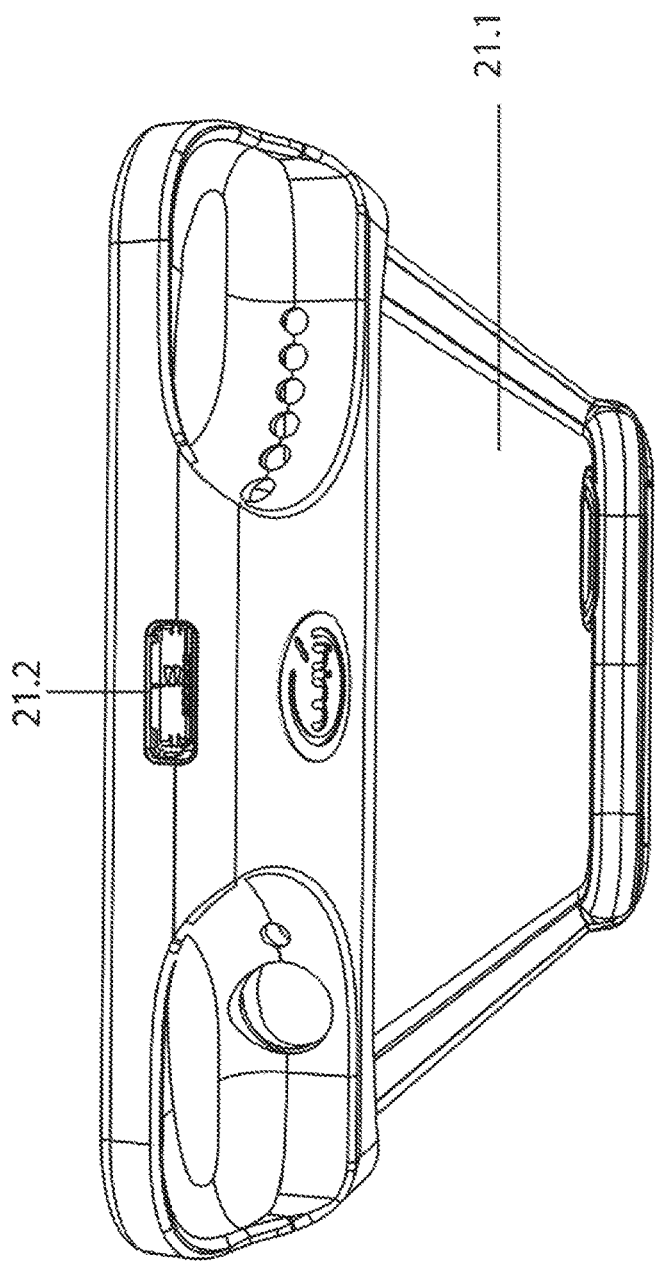
FIG. 21 is a bottom perspective view of a device case according to an exemplary embodiment.

FIG. 21 shows a bottom perspective view of an exemplary embodiment of a device case 21.1. In some embodiments, the device case 21.1 is substantially similar to the various other exemplary device cases described above other than as will be described hereinafter. In some embodiments, the device case 21.1 includes a USB port 21.2. In some embodiments, the USB port 21.2 is configured to charge a mobile device that is connected thereto as discussed above with reference to the USB port 10.6 described above with reference to FIG. 10.

Figure 22:
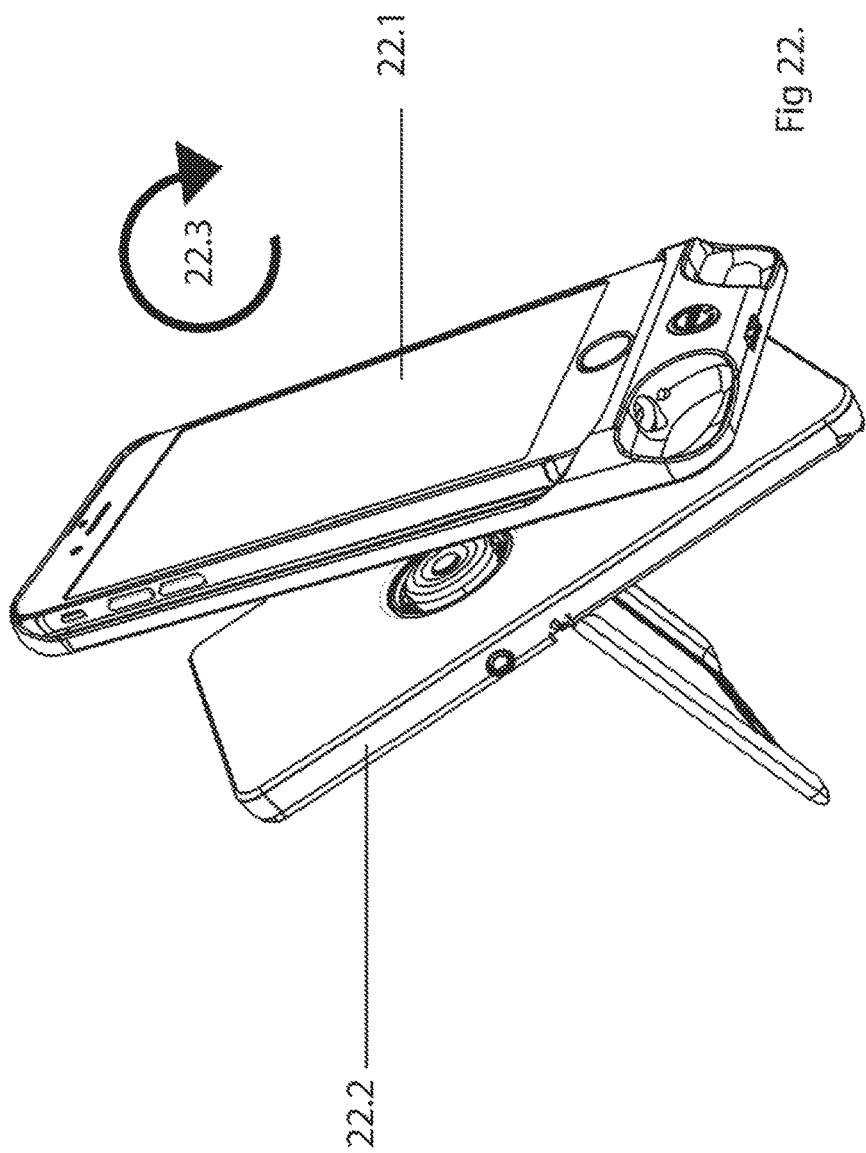
FIG. 22 is a front perspective view of a device case and a battery case according to an exemplary embodiment, the device case shown in the process of being disengaged from the battery case.
Figure 23:
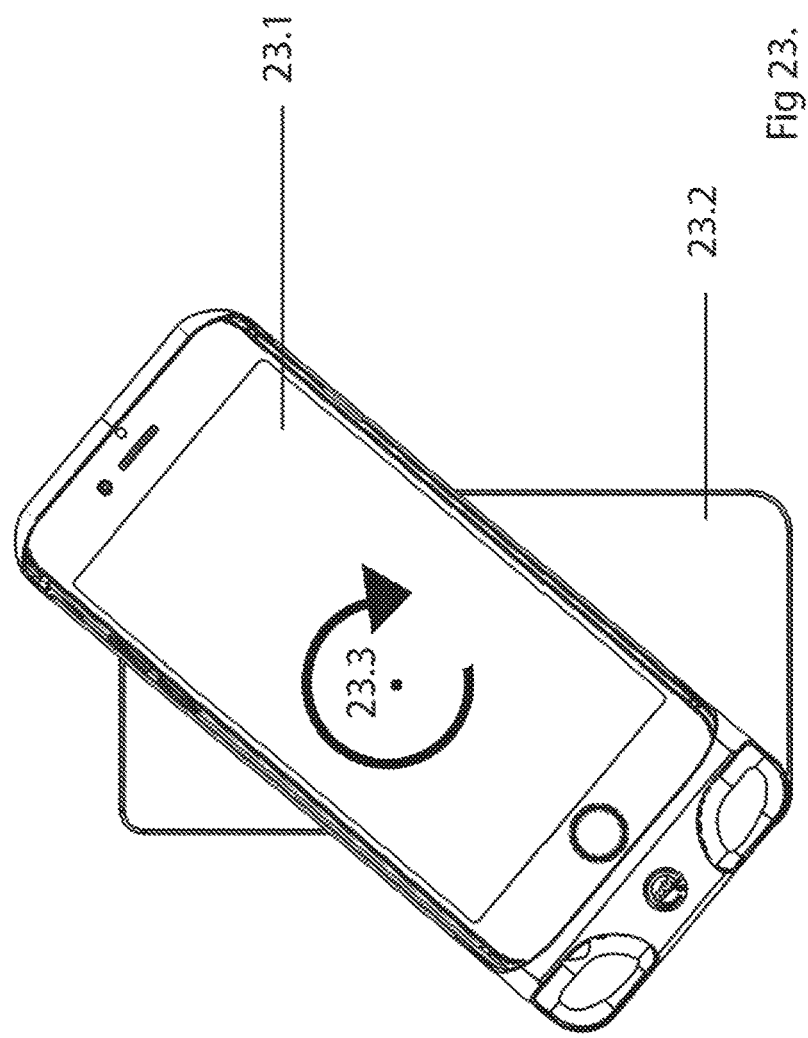
FIG. 23 is a front view of a device case and a battery case according to an exemplary embodiment, the device case shown in the process of being disengaged from the battery case.

FIG. 22 shows motion involved in releasing an exemplary device case 22.1 from an exemplary battery case 22.2. In some embodiments, the device case 22.1 and the battery case 22.3 are substantially similar to the various devices cases and battery cases, respectively, described above. As shown in FIG. 22, a clockwise rotation 22.3 of the device case 22.1 with respect to the battery case 22.2 releases a male connector of the device case 22.1 from a female connector of the battery case 22.2. FIG. 23 shows a front view of the motion shown in perspective in FIG. 22, whereby an exemplary device case 23.1 is rotated in a clockwise direction 23.3 with respect to an exemplary battery case 23.2 to release a male connector of the device case 23.1 from a female connector of the battery case 23.2.

Figure 24:
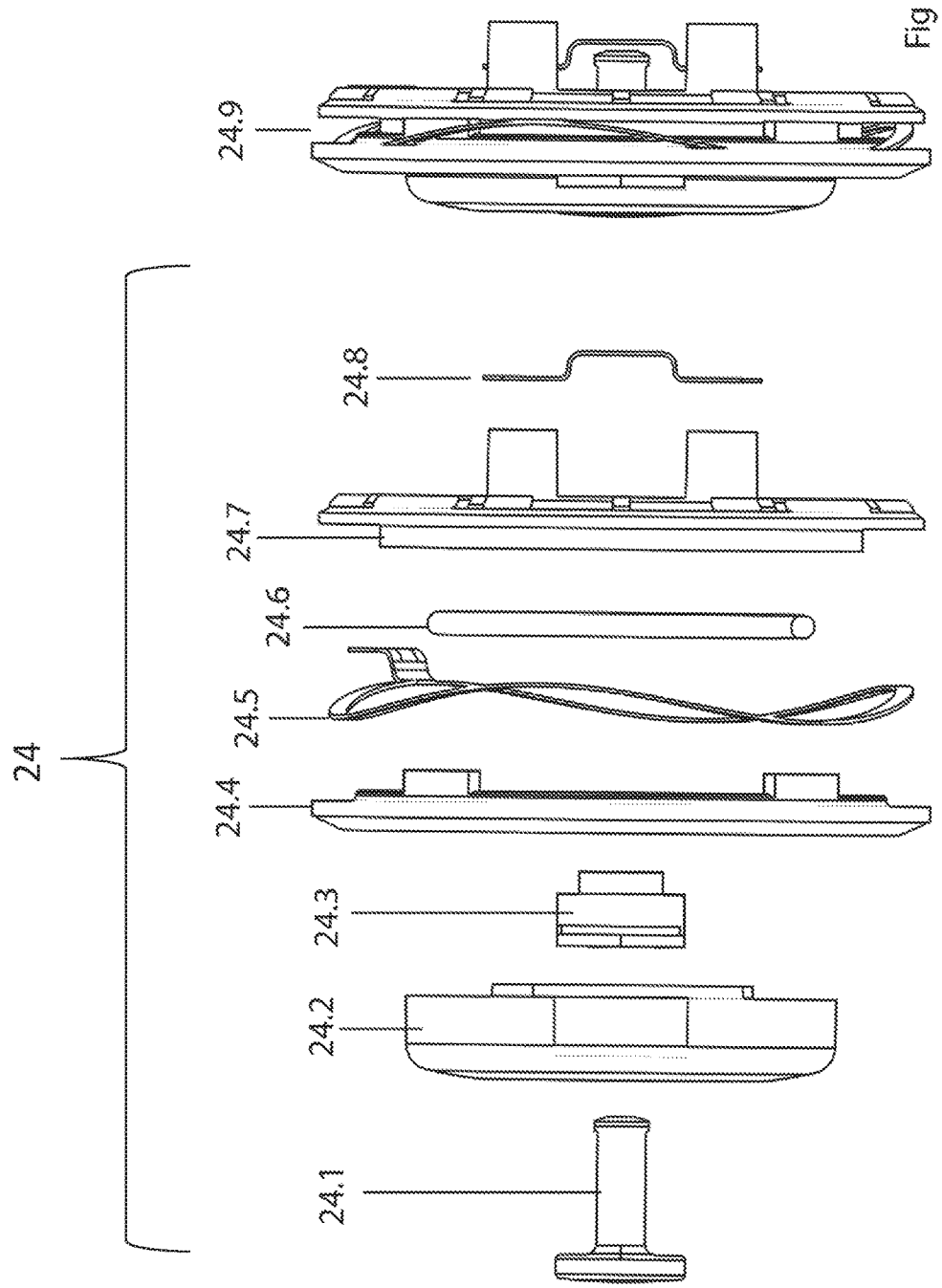
FIG. 24 is a side exploded view of elements of an exemplary female connector of a battery case according to an exemplary embodiment.

FIG. 24 shows an exploded view of a female connector 24 of an exemplary battery case such as the exemplary battery cases described above. In some embodiments, the female connector 24 includes a center DC contact 24.1 that is configured to provide electrical contact to a male connector of an exemplary device case. In some embodiments, the female connector 24 includes a center stack ring 24.2 that provides the exterior aesthetic appearance of the female connector 24 and aligns the various other components of the female connector 24. In some embodiments, the female connector 24 includes at least one latch 24.3. In some embodiments, the at least one latch 24.3 is configured to engage and disengage a male connector. In some embodiments, the at least one latch 24.3 is configured to center and align the female connector 24 with a male connector in the vertical direction. In some embodiments, the at least one latch 24.3 is configured to stop rotation of a male connector with respect to the female connector 24 at 90 degrees in the counterclockwise direction so as to provide a media viewing position as described above with reference to FIG. 8. In some embodiments, the female connector 24 includes a DC contact ring 24.4 that is configured to, in cooperation with the functioning of the center DC contact 24.1, create an electrical connection with a male connector of a device case. In some embodiments, the female connector 24 includes a wave spring 24.5 that is configured to create tension on the various elements of the female connector 24 to keep such components aligned and to exert pressure on the DC contact ring 24.4 so as to ensure that the DC contact ring 24.4 establishes a solid electrical connection with a male connector of a device case. In some embodiments, the female connector 24 includes an outer profile tension spring 24.5 that is configured to create tension necessary for the mating of the female connector 24 with a male connector (i.e., to operate at least one latch, as will be described hereinafter). In some embodiments, the female connector 24 includes at least one boss 24.7 that protrudes through an underlying PCB to the rear of a battery case in which the female connector 24 is installed so as to provide rigidity of the female connector 24 and prevent rotation of the female connector 24. In some embodiments, the female connector 24 includes a metallic contact 24.8 providing electrical communication between the center DC contact 24.1 and an underlying PCB. An assembled female connector 24.9 that includes the various elements of the female connector 24 is also shown.

FIG. 25 shows a front view of elements of a female connector 24 as shown in FIG. 24. In some embodiments, the female connector 24 includes a boss 25.2 that protrudes through an underlying PCB to the rear of a battery case in which the female connector 24 is installed so as to provide rigidity of the female connector 24 and prevent rotation of the female connector 24. In some embodiments, the female connector 24 includes at least one tension spring and latch assembly 25.3 that engages the boss 25.2 and is configured to engage and disengage a male connector, as will be described hereinafter. In some embodiments, the female connector 24 includes an outer profile tension ring 25.4 that creates tension for mating of the male and female connectors as will be described hereinafter. In some embodiments, the female connector 24 includes a center stack ring 25.5 that provides the exterior aesthetic appearance of the female connector 24 and aligns the various other components of the female connector 24. An assembled female connector 25.1 that includes the various elements of the female connector 24 is also shown.

Figure 26B:
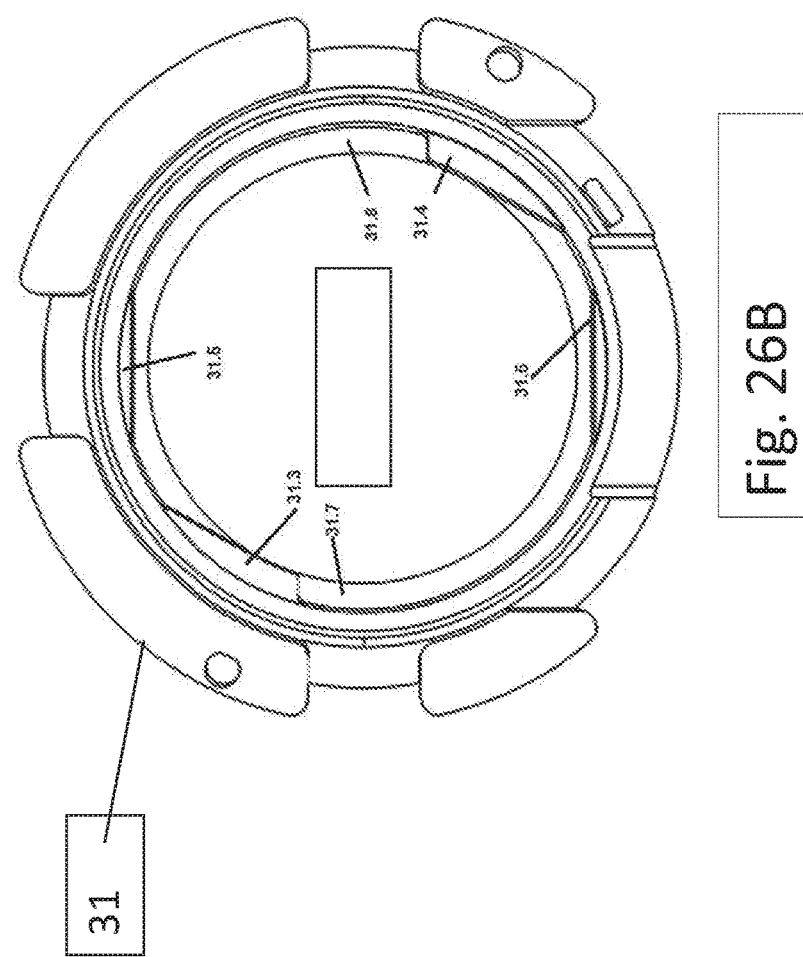
FIG. 26B is a front view of the male connector of FIG. 26A.

FIGS. 26A and 26B show rear and front profile views, respectively, of an exemplary embodiment of a male connector ring 31 that may form a portion of a male connector, such as any of the male connectors described above. Referring now to FIG. 26B, in some embodiments, the male connector ring 31 includes at least one compression ramp 31.5, 31.6. In some embodiments, the male connector ring 31 includes two compression ramps 31.5, 31.6. In some embodiments, the male connector ring 31 includes at least one connector ramp 31.3, 31.4. In some embodiments, the male connector ring 31 includes two connector ramps 31.3, 31.4. In some embodiments, the male connector ring 31 includes at least one retaining region 31.7, 31.8 located between the at least one compression ramp 31.5, 31.6 and the at least one connector ramp 31.3, 31.4. In some embodiments, the male connector ring 31 includes at least two retaining regions 31.7, 31.8 located between the at least one compression ramp 31.5, 31.6 and the at least one connector ramp 31.3, 31.4.

Referring now to FIGS. 32-44, an exemplary embodiment of a connector 300 is illustrated. In some embodiments, the exemplary connector 300 includes a male portion 320 and a female portion 350. In some embodiments, the male portion 320 and the female portion 350 may be integrated into a device case and a battery case, respectively, or vice versa, as described above with reference to the exemplary embodiments shown in FIGS. 1-26B, or into other combinations of devices that are to be releasably connected to one another. For example, the exemplary male portion 320 and the exemplary female portion 350 may be mechanically connected to such devices and/or may be electrically coupled to underlying circuitry providing for transmission of electricity and/or data. However, for brevity and clarity, the male portion 320 and the female portion 350 of the connector 300 will be described herein, without describing the underlying devices FIG. 32 shows a perspective view rendering of the male portion 320 and the female portion 350 side-by-side and facing away from one another. FIG. 33 shows a top perspective view of the male portion 320 and the female portion 350 facing toward one another, but not engaged with one another. FIG. 34 shows a bottom perspective view of the male portion 320 and the female portion 350 facing toward one another, but not engaged with one another. In some embodiments, each of the male portion 320 and the female portion 350 includes a central conductive portion with a conductive wave ring around the central conductive portion and a magnet embedded within a housing. In some embodiments, as will be described in more detail hereinafter, the central magnet housings are configured both to retain the male portion 320 and the female portion 350 in proximity to one another and, therefore, to close a circuit formed by the conductive wave rings and the central conductive portions to allow for AC or DC to pass therethrough to a device that is connected to either the male portion 320 or the female portion 350.

Referring now to FIGS. 35 and 36, exploded views of elements of the male portion 320 are shown. FIG. 35 shows an exploded perspective view of the male portion 320. FIG. 36 shows an exploded perspective view of a rendering of the male portion 320. In some embodiments, the male portion 320 includes a magnet 322. In some embodiments, the magnet 322 may be any type of magnet 322 generating a magnetic field of strength sufficient to allow the male portion 320 and the female portion 350 to be selectively engaged to one another as will be described in further detail hereinafter.

Continuing to refer to FIGS. 35 and 36, in some embodiments, the male portion 320 includes a conductive magnet housing 324. In some embodiments, the magnet housing 324 is configured to retain the magnet 322 in its position within the male portion 320. In some embodiments, the conductive magnet housing 324 is located at a central portion of the assembled male portion 320. In some embodiments, the conductive magnet housing 324 is configured to form a first terminal of an electrical connection. In some embodiments, the conductive magnet housing 324 is electrically coupled to an underlying PCB or other structure that is configured to convey electricity and/or data to and/or from a device to which the male portion 320 is coupled. In some embodiments, the conductive magnet housing 324 is made from any suitable metallic or non-metallic conductive material.

Continuing to refer to FIGS. 35 and 36, in some embodiments, the male portion 320 includes a non-conductive separator 326. In some embodiments, the separator 326 is configured to surround the conductive magnet housing 324. In some embodiments, the separator 326 is configured to provide a non-conductive border around the conductive magnet housing 324. In some embodiments, the separator 326 is formed from any suitable non-conductive material (e.g., a plastic).

Continuing to refer to FIGS. 35 and 36, in some embodiments, the male portion 320 includes a conductive wave ring 328. In some embodiments, the conductive wave ring 328 is configured to surround the separator 326. In some embodiments, the conductive wave ring 328 is located at a radially outer portion of the male portion 320 when the male portion 320 is assembled. In some embodiments, the conductive wave ring 328 is configured to form a second terminal of an electrical connection. In some embodiments, the conductive wave ring 328 is electrically coupled to an underlying PCB or other structure that is configured to convey electricity and/or data to and/or from a device to which the male portion 320 is coupled. In some embodiments, the conductive wave ring 328 is made from any suitable metallic or non-metallic conductive material. In some embodiments, the conductive magnet housing 324, the separator 326, and the conductive wave ring 328 are configured such that the separator 326 prevents any electrical contact between the conductive magnet housing 324 and the conductive wave ring 328. In some embodiments, the conductive wave ring 328 is shaped to selectively retain the male portion 320 in engagement with the female portion 350 in a manner that will be described in detail hereinafter.

Referring now to FIGS. 37 and 38, exploded views of elements of the female portion 350 are shown. FIG. 37 shows an exploded perspective view of the female portion 350. FIG. 38 shows an exploded perspective view of a rendering of the female portion 350. In some embodiments, the female portion 350 includes a magnet 352. In some embodiments, the magnet 352 may be any type of magnet 352 generating a magnetic field of strength sufficient to allow the male portion 320 and the female portion 350 to be selectively engaged to one another as will be described in further detail hereinafter. In some embodiments, the magnet 352 generates a magnetic field such that, when the magnet 352 and the magnet 322 of the male portion 320 are oriented with respect to one another as shown in FIGS. 33 and 34, the magnet 352 and the magnet 322 of the male portion 320 generate a magnetic attractive force with respect to one another.

Continuing to refer to FIGS. 37 and 38, in some embodiments, the female portion 350 includes a conductive magnet housing 354. In some embodiments, the magnet housing 354 is configured to retain the magnet 352 in its position within the female portion 350. In some embodiments, the conductive magnet housing 354 is located at a central portion of the assembled female portion 350. In some embodiments, the conductive magnet housing 354 is configured to form a first terminal of an electrical connection (e.g., in communication with the conductive magnet housing 324 of the male portion 320). In some embodiments, the conductive magnet housing 354 is electrically coupled to an underlying PCB or other structure that is configured to convey electricity and/or data to and/or from a device to which the female portion 350 is coupled. In some embodiments, the conductive magnet housing 354 is made from any suitable metallic or non-metallic conductive material.

Continuing to refer to FIGS. 37 and 38, in some embodiments, the female portion 350 includes a non-conductive separator 356. In some embodiments, the separator 356 is configured to surround the conductive magnet housing 354. In some embodiments, the separator 356 is configured to provide a non-conductive border around the conductive magnet housing 354. In some embodiments, the separator 356 is formed from any suitable non-conductive material (e.g., a plastic).

Continuing to refer to FIGS. 37 and 38, in some embodiments, the female portion 350 includes a conductive wave ring 358. In some embodiments, the conductive wave ring 358 is configured to surround the separator 356. In some embodiments, the conductive wave ring 358 is located at a radially outer portion of the female portion 350 when the female portion 350 is assembled. In some embodiments, the conductive wave ring 358 is configured to form a second terminal of an electrical connection (e.g., in communication with the conductive wave ring 328 of the male portion 320). In some embodiments, the conductive wave ring 358 is electrically coupled to an underlying PCB or other structure that is configured to convey electricity and/or data to and/or from a device to which the female portion 358 is coupled. In some embodiments, the conductive wave ring 358 is made from any suitable metallic or non-metallic conductive material. In some embodiments, the conductive magnet housing 354, the separator 356, and the conductive wave ring 358 are configured such that the separator 356 prevents any electrical contact between the conductive magnet housing 354 and the conductive wave ring 358. In some embodiments, the conductive wave ring 358 is shaped such that the conductive wave ring 358 and the conductive wave ring 328 of the male portion 320 cooperate to selectively retain the male portion 320 in engagement with the female portion 350 in a manner that will be described in detail hereinafter.

Referring now to FIGS. 39-41, exploded views of all of the elements of the connector 300 (i.e., of the male portion 320 and the female portion 350) are shown. FIG. 39 shows a side view of all of the elements of the connector 300, as described above with reference to FIGS. 35-38. FIG. 40 shows a side perspective view of all of the elements of the connector 300, as described above with reference to FIGS. 35-38. FIG. 41 shows a top perspective view of all of the elements of the connector 300, as described above with reference to FIGS. 35-38.

Figure 42:
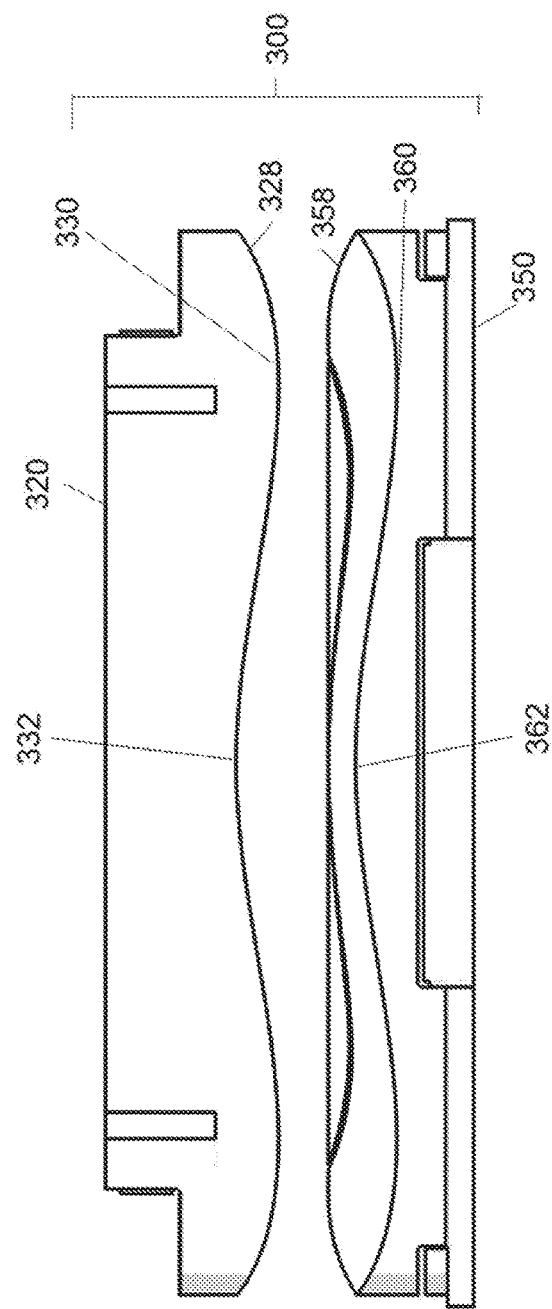
FIG. 42 is a side view of the male connector and the female connector of FIG. 32, the male connector and the female connector being shown oriented so as to engage one another but not engaged with one another.
Figure 43:
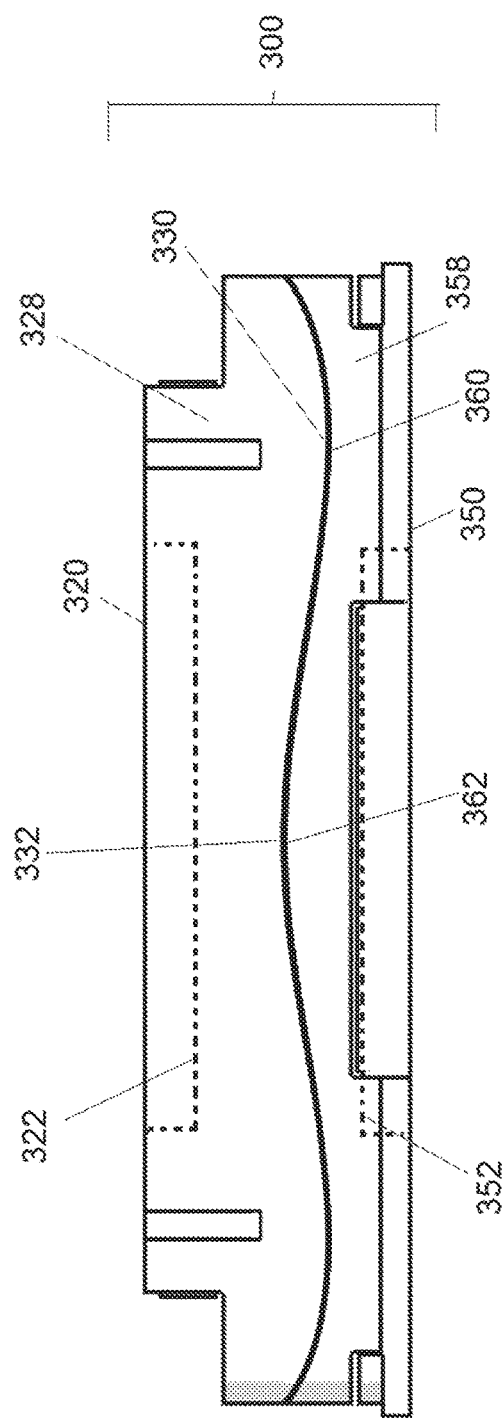
FIG. 43 is a side view of the male connector and the female connector of FIG. 32, the male connector and the female connector being shown engaged with one another.

Referring now to FIGS. 42-44, operation of the connector 300 is illustrated. FIG. 42 shows a side view of the male portion 320 and the female portion 350, as rotationally oriented with respect to one another in a manner that will allow engagement therebetween. Referring now to FIG. 42, in some embodiments, the wave ring 328 of the male portion 320 includes at least one peak 330 (i.e., a portion of the wave ring 328 that is furthest from the magnet 322) and at least one valley 332 (i.e., a portion of the wave ring 328 that is closest to the magnet 322). In some embodiments, the wave ring 358 of the female portion 350 includes at least one valley 360 (i.e., a portion of the wave ring 358 that is closest to the magnet 352) and at least one peak 362 (i.e., a portion of the wave ring 358 that is furthest from the magnet 352). In some embodiments the male portion 320 and female portion 350 are positioned for engagement when the at least one peak 330 of the wave ring 328 of the male portion 320 is aligned with the at least one valley 360 of the wave ring 358 of the female portion 350 and the at least one valley 332 of the wave ring 328 of the male portion 320 is aligned with the at least one peak 362 of the wave ring 358 of the female portion 350.

Referring now to FIG. 43, the male portion 320 and female portion 350 are shown rotationally oriented as in FIG. 42, and moved toward one another so as to engage one another. As shown in FIG. 43, the at least one peak 330 of the wave ring 328 of the male portion 320 is aligned with the at least one valley 360 of the wave ring 358 of the female portion 350 and the at least one valley 332 of the wave ring 328 of the male portion 320 is aligned with the at least one peak 362 of the wave ring 358 of the female portion 350. As a result of moving the male portion 320 and the female portion 350 toward one another, the at least one peak 330 of the wave ring 328 of the male portion 320 is located within the at least one valley 360 of the wave ring 358 of the female portion 350 and the at least one peak 362 of the wave ring 358 of the female portion is located within the least one valley 332 of the wave ring 328 of the male portion 320. Consequently, the magnet 322 of the male portion 320 is located in proximity to the magnet 352 of the female portion 350, retaining the male portion 320 in proximity to the magnet 350. In some embodiments, the magnet 322 of the male portion 320 and the magnet 352 of the female 350 generate magnetic fields of sufficient strength such that, when the male portion 320 and the female portion 350 are positioned as shown in FIG. 43, the male portion 320 and the female portion cannot be pulled away from one another in an axial direction (i.e., in a direction toward the orientation shown in FIG. 42). In some embodiments, the magnet 322 of the male portion 320 and the magnet 352 of the female 350 generate magnetic fields of sufficient strength such that, when the male portion 320 and the female portion 350 are positioned as shown in FIG. 43, the male portion 320 and the female portion cannot easily be pulled away from one another in an axial direction (i.e., in a direction toward the orientation shown in FIG. 42).

FIG. 44 shows a side view of the male portion 320 and the female portion 350 as rotationally oriented with respect to one another in a manner that will allow engagement therebetween. More particularly, in some embodiments, as shown in FIG. 44, the male portion 320 and female portion 350 are positioned for disengagement when the at least one peak 330 of the wave ring 328 of the male portion 320 is aligned with the at least one peak 362 of the wave ring 358 of the female portion 350 and the at least one valley 332 of the wave ring 328 of the male portion 320 is aligned with the at least one valley 360 of the wave ring 358 of the female portion 350. When the male portion 320 and the female portion 350 are so positioned, the at least one peak 362 of the wave ring 358 of the female portion 350 abuts the at least one peak 330 of the wave ring 328 of the male portion 320, preventing the male portion 320 from further approaching the female portion 350 and preventing the magnet 322 of the male portion 320 from engaging the magnet 352 of the female portion 350. As a result, the male portion 320 can be freely moved away from the female portion 350.

In some embodiments, to disengage the connector 300 when the male portion 320 is engaged with the female portion 350 (as shown in FIG. 43), a user rotates a device to which the male portion 320 is attached with respect to a device to which the female portion is attached. When such rotation is performed, the wave ring 328 of the male portion 320 and the wave ring 358 of the female portion 350 act as a cam, converting such rotation to linear motion of the male portion 320 apart from the female portion 350. Such motion generates a distance between the conductive magnet housing 324 of the male portion 320 and the conductive magnet housing 354 of the female portion 350, thereby opening an electrical circuit that was closed by contact between the conductive magnet housing 324 of the male portion 320 and the conductive magnet housing 354 of the female portion 350. Additionally, such motion increases a distance between the magnet 322 of the male portion 320 and the magnet 352 of the female portion 350, thereby reducing the magnetic attractive force generated between the magnet 322 of the male portion 320 and the magnet 352 of the female portion 350 and enabling the male portion 320 and the female portion 350 to be easily moved away from another in opposition to the resulting magnetic attractive force. In some embodiments, the magnet 322 of the male portion 320 and the magnet 352 of the female portion 350 cooperate to generate a magnetic attractive force of sufficient strength such that, when the male portion 320 and the female portion 350 are positioned as shown in FIG. 43, the male portion 320 and the female portion 350 cannot easily be pulled apart from one another, and such that, when the male portion 320 and the female portion 350 are positioned as shown in FIG. 44, the male portion 320 and the female portion 350 can easily be pulled apart from one another.

In some embodiments, the wave ring 328 of the male portion 320 and the wave ring 358 of the female portion 350 are capable of 360 degree rotation with respect to one another. In a default position at zero degrees, the wave ring 358 and the wave ring 328 complement each other, with the at least one peak 330 of the male portion 320 aligned with the at least one valley 360 of the female portion 350 and the at least one peak 362 of the female portion 350 aligned with the at least one valley 332 of the male portion 320 (i.e., as shown in FIG. 42). FIG. 2 shows an example of a default position of zero degrees. In some embodiments, in a position at 90 degrees, the wave ring 358 and the wave ring 328 complement each other, with the at least one peak 330 of the male portion 320 aligned with the at least one valley 360 of the female portion 350 and the at least one peak 362 of the female portion 350 aligned with the at least one valley 332 of the male portion 320 (i.e., as shown in FIG. 42). FIG. 8 shows an example of a position of 90 degrees. In some embodiments, in positions at 180 degrees and 270 degrees, the wave ring 358 and the wave ring 328 complement each other, with the at least one peak 330 of the male portion 320 aligned with the at least one valley 360 of the female portion 350 and the at least one peak 362 of the female portion 350 aligned with the at least one valley 332 of the male portion 320 (i.e., as shown in FIG. 42). In some embodiments, at intervals of 45 degrees between the aligned positions noted above (i.e., at 45 degrees, 135 degrees, 225 degrees, and 315 degrees), the wave ring 358 and the wave ring 328 do not complement each other, with the at least one peak 330 of the male portion 320 aligned with the at least one peak 362 of the female portion 350 and the at least one valley 360 of the female portion 350 aligned with the at least one valley 332 of the male portion 320 (i.e., as shown in FIG. 44). It will be apparent to those of skill in the art that the specific combinations of angles noted above (i.e., complementary positions offset from one another by 90 degrees, with noncomplementary positions offset from one another by 90 degrees and from complementary positions by 45 degrees) is only exemplary and that other combinations of angles are possible without departing from the broader principles described above.

Referring now to FIGS. 27-31B, an exemplary embodiment of a connector 400 is shown. The connector 400 includes a male portion 410 and a female portion 430. The connector 400 operates in a manner similar to that of the connector 300 other than as will be described hereinafter.

FIG. 27 illustrates an exploded view of elements of the female portion 430. In some embodiments, the female portion 430 includes a magnet 432. In some embodiments, a plurality of contacts 434 are embedded within a face portion of the magnet 432. In some embodiments, each of the contacts 434 is coupled to a corresponding one of a plurality of leads 436 extending through the side or rear of the magnet 432. In some embodiments, each of the leads 436 is electrically coupled to an underlying PCB or other structure as described above.

Continuing to refer to FIG. 27, in some embodiments, the female portion 430 includes a non-conductive contact housing 438. In some embodiments, the contact housing 438 is made from any suitable non-conductive material (e.g., a plastic). In some embodiments, the contact housing 438 is configured to prevent the contacts 434 from electrical contact with one another and to retain the contacts 434 within the magnet 432.

Continuing to refer to FIG. 27, in some embodiments, the female portion 430 includes cosmetic adhesive paper 440. In some embodiments, the cosmetic adhesive paper 440 is configured to adhere to the contact housing 438 and to provide an aesthetically pleasing appearance.

Continuing to refer to FIG. 27, in some embodiments, the female portion 430 includes a wave ring 442. In some embodiments, the wave ring 442 is not electrically conductive. In some embodiments, the wave ring 442 is configured to provide rotational engagement and disengagement of the female portion 430 with the male portion 410 as described above with reference to the wave ring 358 of the female portion 350.

Figure 28:
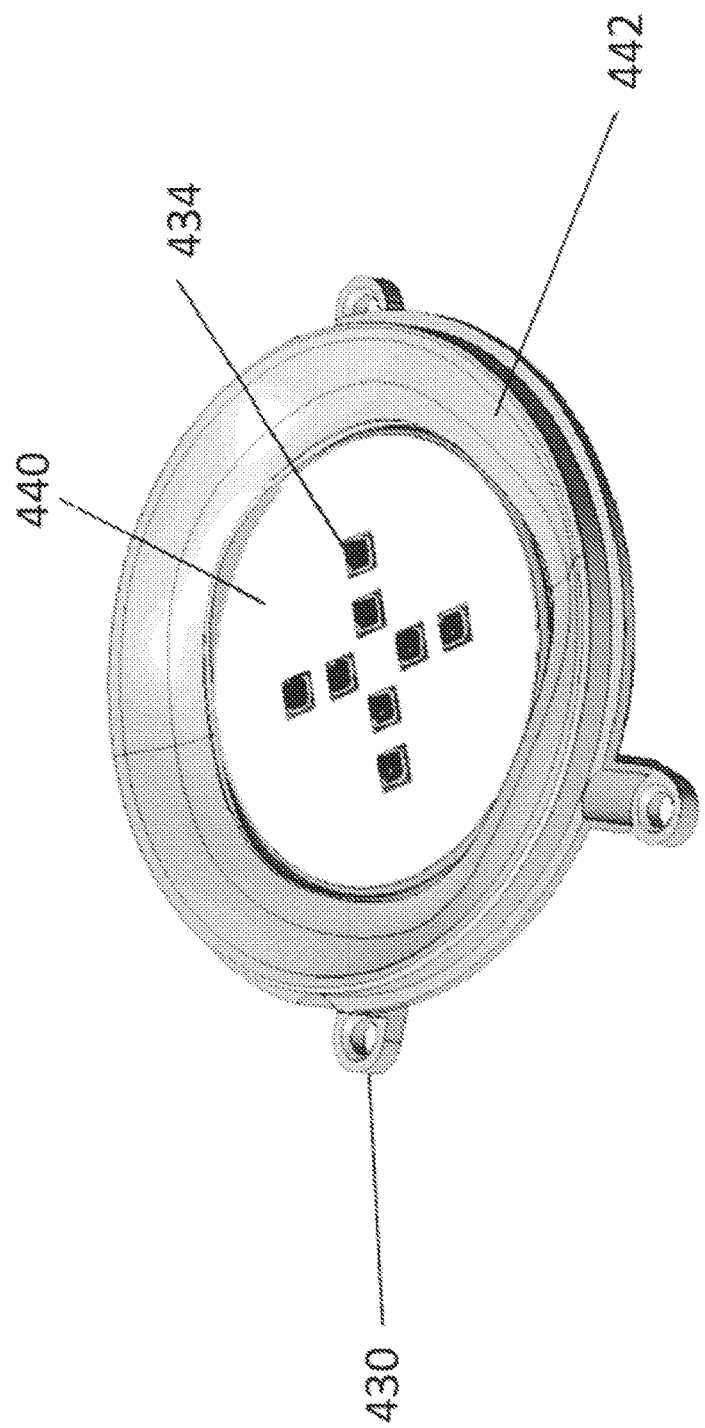
FIG. 28 is an assembled view of an exemplary embodiment of a female connector including the components shown in the exploded view of FIG. 27.

FIG. 28 shows an assembled view of the female portion 430. In some embodiments, the contacts 434 protrude through the contact housing 438 and the cosmetic adhesive paper 440 and are exposed in the central portion of the female portion 430.

Figure 29:
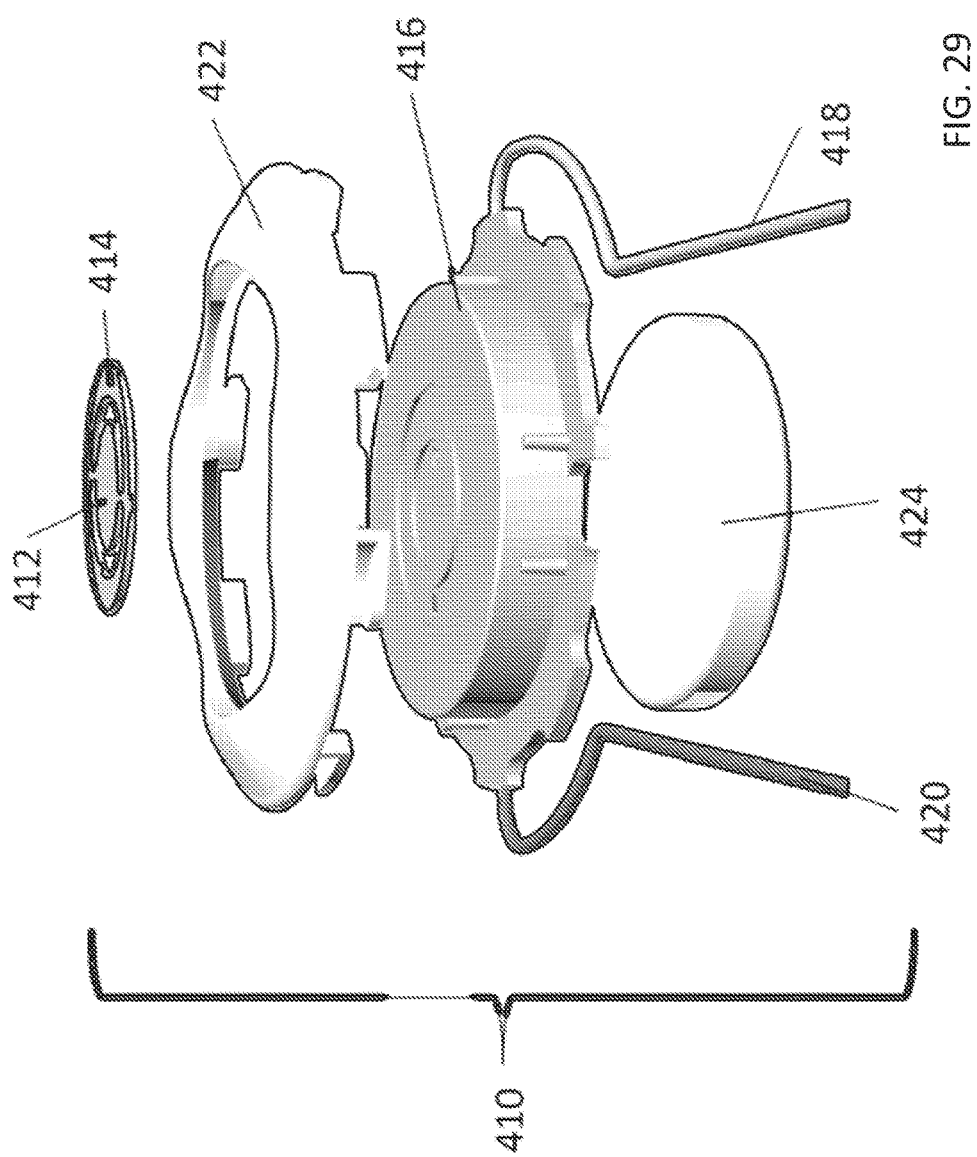
FIG. 29 is an exploded view of an exemplary embodiment of a male connector that is configured to mate with the exemplary embodiment of a female connector shown in FIGS. 27 and 28.

FIG. 29 shows an exploded view of the male portion 410. In some embodiments, the male portion 410 includes a center contact 412 and a ring contact 414. In some embodiments, the center contact 412 and the ring contact 414 are positioned within a non-conductive magnet housing 416. In some embodiments, the center contact 412 and the ring contact 414 are press fit to the non-conductive magnet housing 416. In some embodiments, the center contact 412 and the ring contact 414 are fixed to the non-conductive magnet housing 416 by an adhesive. In some embodiments, the center contact 412 and the ring contact 414 are fixed to the non-conductive magnet housing 416 by another suitable engagement mechanism. In some embodiments, the non-conductive magnet housing 416 prevents the center contact 412 and the ring contact 414 from electrical contact with one another. In some embodiments, the non-conductive magnet housing 416 retains the center contact 412 and the ring contact 414 in relative positions such that, when the male portion 410 engages the female portion 430, the center contact 412 contacts at least one of the contacts 434 of the female portion 430 and the ring contact 414 contacts a different at least one of the contacts 434 of the female portion 430.

Continuing to refer to FIG. 29, in some embodiments, the center contact 412 is electrically coupled to a first lead 418 and the ring contact 414 is electrically coupled to a second lead 420 that are located to the opposite side of the non-conductive magnet housing 416 from the center contact 412 and the ring contact 414. The first and second leads 418, 420 may be electrically coupled to an underlying PCB or other structure as described above.

The male portion 410 is described herein with reference to a center contact 412 and a ring contact 414. In some embodiments, the center contact 412 and the ring contact 414 are coupled to a positive and negative lead, respectively, or vice versa, of a DC power input or a DC power output. In some embodiments, the center contact 412 and the ring contact 414 are coupled to a neutral and hot lead, respectively, or vice versa, of an AC power input or an AC power output. However, it will be apparent to those of skill in the art that, in some embodiments, the male portion 410 may include more than one of the ring contact 414, and that such additional ring contacts 414 may be may be coupled to additional leads (not shown) that are configured to convey a data signal, an audio signal, a video signal, or any other type of data or information that may be conveyed via an electrical conductor.

Continuing to refer to FIG. 29, in some embodiments, the male portion 410 includes a wave ring 422. In some embodiments, the wave ring 422 is not electrically conductive. In some embodiments, the wave ring 422 is configured to provide rotational engagement and disengagement of the male portion 410 with the female portion 430 as described above with reference to the wave ring 328 of the female portion 320.

Figure 30:
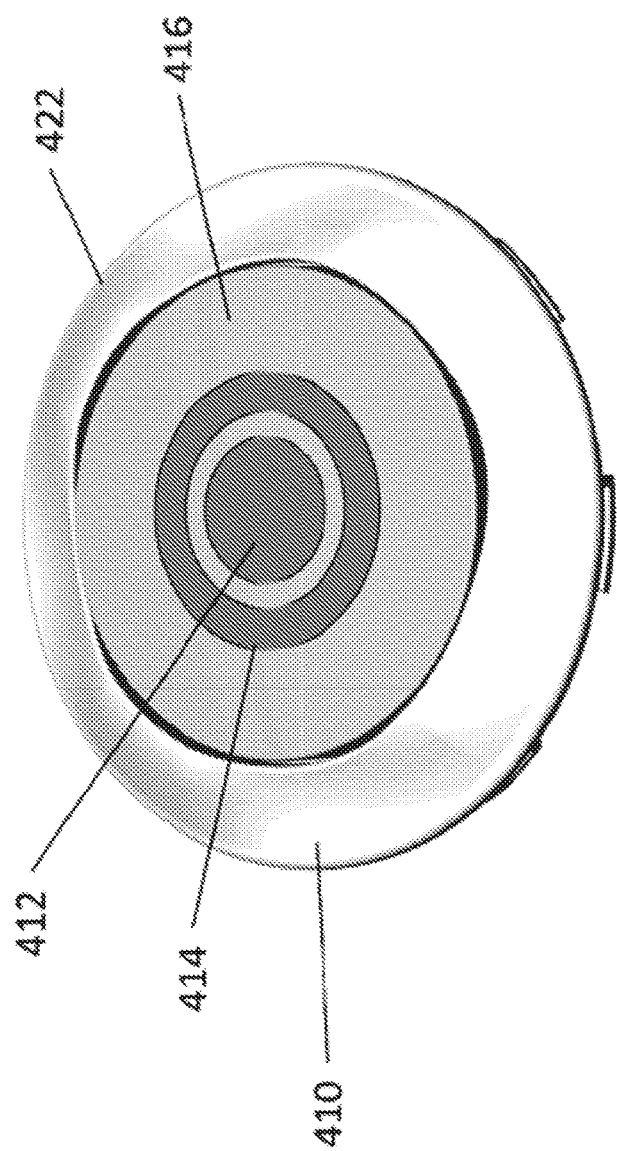
FIG. 30 is an assembled view of an exemplary embodiment of a male connector including the components shown in the exploded view of FIG. 29.

Continuing to refer to FIG. 29, in some embodiments, the male portion 410 includes a magnet 424 positioned within the non-conductive magnet housing 416. In some embodiments, the magnet 424 is substantially similar to the magnet 322 of the male portion 320 described above. FIG. 30 shows an assembled view of the male portion 410.

Figure 31A:
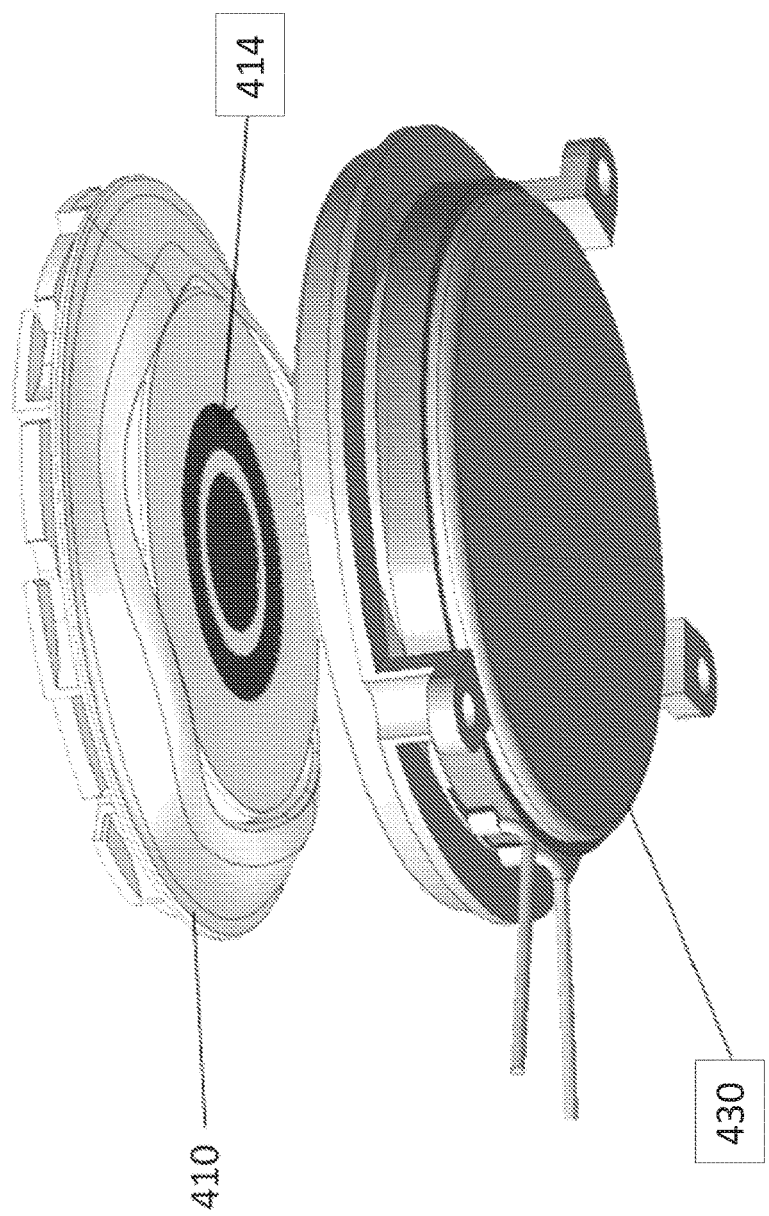
FIG. 31A is a bottom perspective view of the exemplary female connector of FIG. 28 and the exemplary male connector of FIG. 30.
Figure 31B:
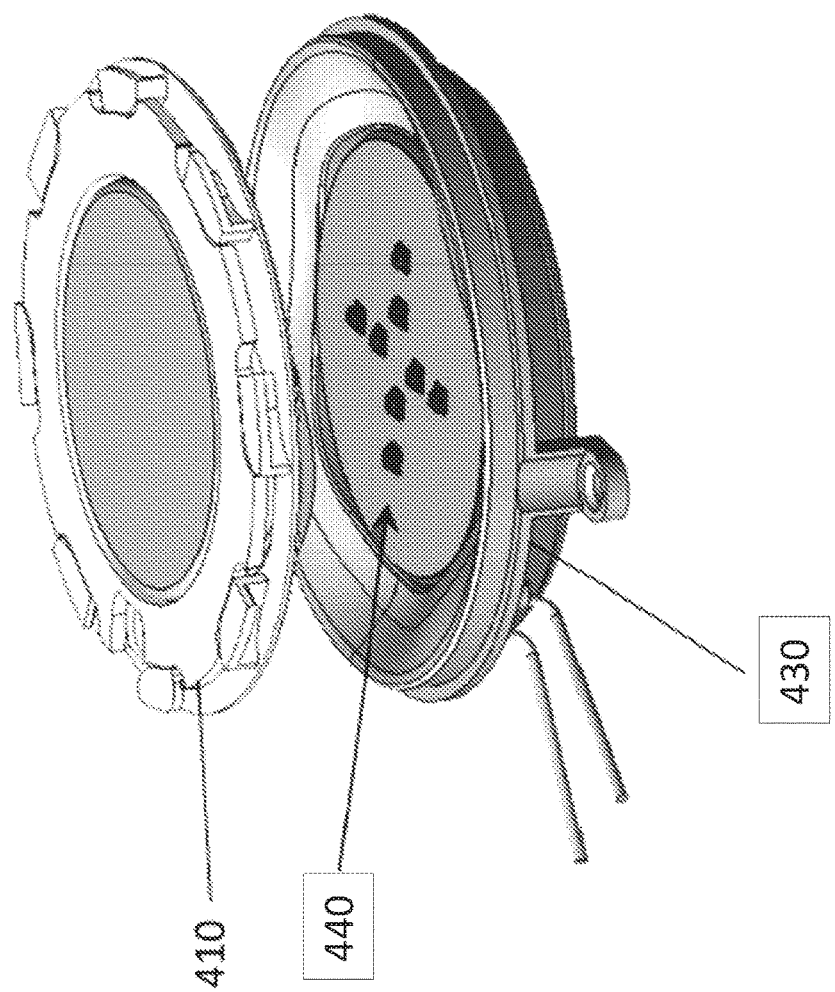
FIG. 31B is a top perspective view of the exemplary female connector of FIG. 28 and the exemplary male connector of FIG. 30.

FIG. 31A is a bottom perspective view of the male portion 410 and the female portion 430 positioned to be engaged with one another. FIG. 31B is a top perspective view of the male portion 410 and the female portion 430 positioned to be engaged with one another. In some embodiments, the wave ring 422 of the male portion 410 and the wave ring 442 of the female portion cooperate to allow the magnet 424 of the male portion 410 and the magnet 432 of the female portion 430 to be in proximity to one another, or to force the magnet 424 of the male portion 410 and the magnet 432 of the female portion 430 away from one another, as described above with reference to the wave ring 358 of the male portion 350 and the wave ring 328 of the female portion 320. In some embodiments, when the male portion 410 and the female portion 430 are in close engagement with one another, the center contact 412 and the ring contact 414 of the male portion 410 each contact a corresponding at least one of the contacts 434 of the female portion 430. In some embodiments, when the male portion 410 and the female portion 430 are rotated with respect to one another such that the relative positions of the wave ring 422 of the male portion 410 and the wave ring 442 of the female portion 430 move the male portion 410 and the female portion 430 away from one another, the center contact 412 and the ring contact 414 of the male portion 410 do not contact any of the contacts 434 of the female portion 430.

In some embodiments, while above examples illustrate the exemplary inventive multifunctional connection systems of the present invention in which an exemplary inventive female connector and an exemplary inventive male connector would have mechanical and electrical connections, it is readily appreciated that the exemplary inventive female connector and the exemplary inventive male connector can be suitably configured to, for example but not limited to, have, in accordance with at least some principles of the present invention:

1) only mechanical connection, or
2) an additional connection type (e.g., data transfer connection).

In some embodiments, while above examples illustrate the exemplary inventive multifunctional connection systems of the present invention and the inventive principles of their constriction and use with respect to engaging and disengaging an exemplary external battery case to an exemplary phone case housing an exemplary device, such as an exemplary smartphone, it is readily appreciated that one of the mating inventive connector can be incorporated into the back cover of an exemplary device, such as an exemplary smartphone.

In some embodiments, while above examples illustrate the exemplary inventive multifunctional connection systems of the present invention and the inventive principles of their constriction and use with respect to engaging and disengaging an exemplary external battery case to an exemplary phone case housing an exemplary device, such as an exemplary smartphone, it is readily appreciated that instead of the exemplary battery case, another item can be attached to the exemplary phone case housing the exemplary device. For example, in some embodiments, another item can be an electronic device having an Input interface, an Output interface, or an Input/Output interface.

For example, in some embodiments, another item can be an accessory. In some embodiments, a particular accessory can be selected from at least one of the following groups of suitable accessories: 1) passive accessories; 2) active input accessories; and 3) active output accessories. For example, each suitable accessory would share at least one common inventive feature of the present invention such as an exemplary inventive male or an exemplary inventive female connector which would be configured to connect to respective inventive connector resided within an exemplary battery case or an exemplary phone case. For example, all accessories would have the exemplary inventive male connector which would connect to the exemplary inventive female connector on the battery case to allow them to be carried together.

Group ONE: Passive Accessories

Accessories that can be attached to, for example but not limited to, the battery case without making use of the battery or any electronic parts such as:

A Wallet accessory
Headphone box accessory
Business card box accessory
Photographers card carrier box.

Group Two: Active Input

Accessories which can charge the battery case such as:
Solar panel which once engaged and expose to light can charge the battery case Group Three: Active Output Accessories that can make use of the battery case to power or charger them such as:

Make-up mirror kit with LED light

Adapters for various batteries of third party manufactures such as, but not limited to, GoPro battery adapter, Drone battery adapter, etc.

Flashlight accessory

Car mount accessory.

For example, in some embodiments, at least some parts and principles of an exemplary inventive multifunctional connection system (e.g., inventive arrangement and operation of latches and ramps of an exemplary inventive male connector and an exemplary inventive female connector) can be utilized for connecting together various non-electronic devices and/or parts of various non-electronic devices.

While a number of embodiments of the present invention have been described, it is understood that these embodiments are illustrative only, and not restrictive, and that many modifications may become apparent to those of ordinary skill in the art.

What is claimed is:

1. A charging device for charging a mobile device having a mobile device back surface and a mobile device vertical axis, the charging device comprising:
    a body having a body vertical axis, a body horizontal axis that is perpendicular to the body vertical axis, and a body rotational axis that is perpendicular to the body vertical axis and to the body horizontal axis;
    a power plug integrated in the body; and
    a charging and mounting support integrated on a front surface of the body, said charging and mounting support being configured to detachably and mechanically mount and electronically connect a back interface integrated on the back surface of the mobile device, the charging and mounting support being configured to charge the mobile device when the charging and mounting support is coupled to a power connector of the back interface of the mobile device;
    wherein the charging and mounting support is configured to allow the back interface to rotate with respect to the charging and mounting support about the body rotational axis when the back interface is mounted to the charging and mounting support, and
    wherein the front surface of the body includes one of (a) a female connector configured to receive and mechanically couple with a male connector protruding from the mobile device back surface of the mobile device or (b) the male connector configured to be received by and mechanically couple with the female connector formed in the mobile device back surface of the mobile device, whereby the female connector and the male connector cooperate to prevent the mobile device from moving away from the body along the body rotational axis when the mobile device vertical axis is either (a) parallel to the body vertical axis or (b) perpendicular to the body vertical axis, and wherein the female connector and the male connector cooperate to allow the mobile device to move with respect to the body along the body rotational axis when the mobile device vertical axis is oriented diagonally with respect to the body vertical axis.

2. The charging device of claim 1, wherein the front surface of the body includes the female connector, and wherein the female connector forms a part of the charging and mounting support.

3. The charging device of claim 1, wherein the front surface of the body includes the male connector, and wherein the male connector forms a part of the charging and mounting support.

4. The charging device of claim 1, wherein the back interface is configured to allow the mobile device to move away from the charging device at a diagonal orientation relative to the charging device and to restrain the mobile device from moving away from the charging device at a landscape orientation and a portrait orientation relative to charging device.

5. The charging device of claim 1, wherein the back interface is integrated on a back surface of a mobile device case encasing the mobile device.

6. The charging device of claim 5, wherein the back interface is electronically connected to a device plug integrated on a bottom of the mobile device case for connecting to a power jack located at the bottom face of the mobile device.

7. The charging device of claim 6, wherein the back interface is electronically connected to the device plug via a flex PCB interface.

8. The charging device of claim 1, further comprising a battery.

9. The device of claim 8, wherein the battery is integrated in the body.

10. The device of claim 8, wherein the battery is charged through the power plug.

11. The device of claim 8, wherein the mobile device is charged from the battery.

12. The device of claim 1, further comprising:
    a magnet embedded in the charging and mounting support.

13. The device of claim 12, wherein the charging and mounting support includes a wave ring including a plurality of peaks and a plurality of valleys.

14. A kit for charging a mobile device, comprising:
    a charging device, comprising:
        a body having a body vertical axis, a body horizontal axis that is perpendicular to the body vertical axis, and a body rotational axis that is perpendicular to the body vertical axis and to the body horizontal axis;
        a power plug integrated into the body; and
        a charging and mounting support integrated on a front surface of the body; and
    a mobile device case having a mobile device vertical axis, the mobile device case comprising a back interface integrated into a back surface of the mobile device case, the back interface configured to be detachably mechanically mounted and electrically connected to the charging and mounting support;
    wherein the front surface of the body includes one of (a) a female connector or (b) a male connector,
    wherein the back surface of the mobile device case includes the other one of (a) the female connector or (b) the male connector, and wherein the male connector is configured to be received by and mechanically couple with the female connector,
    wherein the female connector and the male connector cooperate to prevent the mobile device case from moving away from the body along the body rotational axis when the mobile device vertical axis is either (a) parallel to the body vertical axis or (b) perpendicular to the body vertical axis,
    wherein the female connector and the male connector cooperate to allow the mobile device case to move away from the body along the body rotational axis when the mobile device vertical axis is oriented diagonally with respect to the body vertical axis, and wherein, when the male connector is received within the female connector, a power connector of the charging and mounting support is connected physically and electronically to a power connector of the back interface.

15. The kit of claim 14, wherein each of the male connector and the female connector includes a magnet embedded therein, and wherein the magnet of the male connector and the magnet of the female connector are configured to generate an attractive magnetic with respect to one another, whereby the charging device and the mobile device case are retained in proximity to one another.

16. The kit of claim 15, wherein each of the male connector and the female connector includes a wave ring, the wave ring of the male connector and the wave ring of the female connector being configured such that when the male connector is coupled with the female connector, the wave ring of the male connector and the wave ring of the female connector are positioned circumferentially around the body rotational axis.

17. The kit of claim 16, wherein the wave ring of the male connector includes a plurality of peaks and a plurality of valleys, wherein the wave ring of the female connector includes a plurality of peaks and a plurality of valleys, wherein the wave ring of the male connector and the wave ring of the female connector are configured such that when the mobile device vertical axis is either (a) parallel to the body vertical axis or (b) perpendicular to the body vertical axis, at least one of the peaks of the wave ring of the male connector is rotationally aligned with at least one of the valleys of the wave ring of the female connector, whereby the wave ring of the male connector and the wave ring of the female connector cooperate to produce a first distance between the magnet of the male connector and the magnet of the female connector, wherein the wave ring of the male connector and the wave ring of the female connector are configured such that when the mobile device vertical axis is oriented diagonally with respect to the body vertical axis, at least one of the peaks of the wave ring of the male connector is rotationally aligned with at least one of the peaks of the wave ring of the female connector, whereby the wave ring of the male connector and the wave ring of the female connector cooperate to produce a second distance between the magnet of the male connector and the magnet of the female connector, the second distance being greater than the first distance.

18. The kit of claim 17, wherein when the magnet of the male connector and the magnet of the female connector are separated from one another by the second distance, the magnetic attractive force generated between the magnet of the male connector and the magnet of the female connector is such that the charging device can be easily moved away from the mobile device case.

19. The kit of claim 14, wherein the mobile device case includes at least one hole configured to provide access to a speaker of a mobile device received therein.

20. A method for manufacturing a charging device for charging a mobile device, the method comprising:

providing a body having a length dimension along a body vertical axis, a width dimension along a body horizontal axis that is perpendicular to the body vertical axis, and a thickness dimension along a rotational axis that is perpendicular to the body vertical axis and to the body horizontal axis, with the thickness dimension being substantially smaller than the length dimension and the width dimension, a power plug and a charging and mounting support;

integrating the power plug in the body;

integrating the charging and mounting support on a front surface of the body; and providing, in the front surface of the body, one of (a) a female connector configured to receive and mechanically couple with a male connector protruding from a back surface of the mobile device or (b) a male connector configured to be received by and mechanically couple with a female connector formed in the back surface of the mobile device, the male connector and the female connector configured such that, when the male connector is received within the female connector, the mobile device is rotatable with respect to the body about the body rotational axis, the female connector and the male connector cooperate to prevent the mobile device from moving away from the body along the body rotational axis when the mobile device vertical axis is either (a) parallel to the body vertical axis or (b) perpendicular to the body vertical axis, and the female connector and the male connector cooperate to allow the mobile device to move with respect to the body along the body rotational axis when the mobile device vertical axis is oriented diagonally with respect to the body vertical axis, wherein the male connector and the female connector are configured such that, when the male connector is received within the female connector, a power connector of the charging and mounting support is connected physically and electronically to a power connector of the mobile device.

* * * * *